(12) United States Patent
Shibata et al.

(10) Patent No.: US 12,483,241 B2
(45) Date of Patent: Nov. 25, 2025

(54) SEMICONDUCTOR DEVICE

(71) Applicant: ROHM CO., LTD., Kyoto (JP)

(72) Inventors: Kotaro Shibata, Kyoto (JP); Masaaki Matsuo, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 120 days.

(21) Appl. No.: 18/495,447

(22) Filed: Oct. 26, 2023

(65) Prior Publication Data

US 2024/0056073 A1 Feb. 15, 2024

Related U.S. Application Data

(63) Continuation of application No. PCT/JP2022/022797, filed on Jun. 6, 2022.

(30) Foreign Application Priority Data

Jun. 17, 2021 (JP) .................................. 2021-100830

(51) Int. Cl.
*H03K 17/68* (2006.01)
*H01L 23/00* (2006.01)
(Continued)

(52) U.S. Cl.
CPC ....... *H03K 17/6871* (2013.01); *H01L 23/645* (2013.01); *H01L 24/48* (2013.01);
(Continued)

(58) Field of Classification Search
CPC .......... H03K 17/6871; H03K 2217/009; H01L 23/645; H01L 24/48; H01L 25/072; H01L 2224/48225; H01L 2924/13091
See application file for complete search history.

(56) References Cited

U.S. PATENT DOCUMENTS 9,614,477 B1 * 4/2017 Rozenblit ................. H03F 3/68
2021/0134762 A1 * 5/2021 Hayashi ................. H01L 23/053

FOREIGN PATENT DOCUMENTS

JP 2016-225493 12/2016
JP 2017-524267 8/2017
(Continued)

OTHER PUBLICATIONS

International Search Report issued in International Application No. PCT/JP2022/022797, Aug. 23, 2022, 3 pages.
(Continued)

*Primary Examiner* — Daniel C Puentes
(74) *Attorney, Agent, or Firm* — HSML P.C.

(57) ABSTRACT

A semiconductor device includes first semiconductor elements, a control terminal, a first conductive member, and first circuit components. The first semiconductor elements are connected in parallel, and a switching operation of each first semiconductor element is controlled according to a first drive signal inputted to a third electrode of each first semiconductor element. The first conductive member is electrically connected to the control terminal to which the first drive signal is inputted, and is electrically interposed between the third electrodes. The first conductive member includes connecting members and a portion of a signal wiring section. Each of the first circuit components increases an impedance in a first frequency band. The first frequency band includes a resonance frequency of a resonance circuit that is formed by including a parasitic inductance of the first conductive member. The third electrodes of the first semiconductor elements are electrically connected to each other via at least one of the first circuit components.

13 Claims, 23 Drawing Sheets

(51) Int. Cl.
   *H01L 23/64* (2006.01)
   *H01L 25/07* (2006.01)
   *H03K 17/687* (2006.01)

(52) U.S. Cl.
   CPC .. *H01L 25/072* (2013.01); *H01L 2224/48225* (2013.01); *H01L 2924/13091* (2013.01); *H03K 2217/009* (2013.01)

(56) References Cited

FOREIGN PATENT DOCUMENTS

| JP | 2021-044996 | | 3/2021 |
|----|----|----|----|
| WO | 2020/054806 | | 3/2020 |
| WO | WO-2021049091 | A1 * | 3/2021 |

OTHER PUBLICATIONS

Written Opinion issued in International Application No. PCT/JP2022/022797, Aug. 23, 2022, 3 pages.

\* cited by examiner

SEMICONDUCTOR DEVICE

TECHNICAL FIELD

The present disclosure relates to a semiconductor device.

BACKGROUND ART

Conventionally, semiconductor devices provided with power semiconductor elements, such as metal oxide semiconductor field effect transistors (MOSFETs) and insulated gate bipolar transistors (IGBTs), have been known. It is also known that the current-carrying capacity of such a semiconductor device is ensured by connecting a plurality of power semiconductor elements in parallel (e.g., JP-A-2016-225493). A power module described in JP-A-2016-225493 includes a plurality of first semiconductor elements, a plurality of first connecting lines, a wiring layer, and a signal terminal. The first semiconductor elements are MOSFETs, for example. Each of the first semiconductor elements turns on and off according to a drive signal inputted to its gate terminal. The first semiconductor elements are connected in parallel. The first connecting lines, which may be wires, connect the gate terminals of the first semiconductor elements to the wiring layer. The wiring layer is connected to the signal terminal. The signal terminal is thus connected to the gate terminals of the first semiconductor elements via the wiring layer and the first connecting lines. The signal terminal provides a drive signal for driving each of the first semiconductor elements to the gate terminals of the first semiconductor elements.

DETAILED DESCRIPTION OF EMBODIMENTS

The following describes preferred embodiments of a semiconductor device according to the present disclosure with reference to the drawings. In the following description, the same or similar elements are denoted by the same reference signs and a description of such an element will not be repeated. The terms such as "first", "second" and "third" in the present disclosure are used merely as labels and not intended to impose orders on the elements accompanied with these terms.

In the present disclosure, the phrases "an object A is formed in an object B" and "an object A is formed on an object B" include, unless otherwise specified, "an object A is formed directly in/on an object B" and "an object A is formed in/on an object B with another object interposed between the object A and the object B". Similarly, the phrases "an object A is disposed in an object B" and "an object A is disposed on an object B" include, unless otherwise specified, "an object A is disposed directly in/on an object B" and "an object A is disposed in/on an object B with another object interposed between the object A and the object B". Similarly, the phrase "an object A is located on an object B" includes, unless otherwise specified, "an object A is located on an object B in contact with the object B" and "an object A is located on an object B with another object interposed between the object A and the object B". Furthermore, the phrase "an object A overlaps with an object B as viewed in a certain direction" includes, unless otherwise specified, "an object A overlaps with the entirety of an object B" and "an object A overlaps with a portion of an object B".

Figure 3:
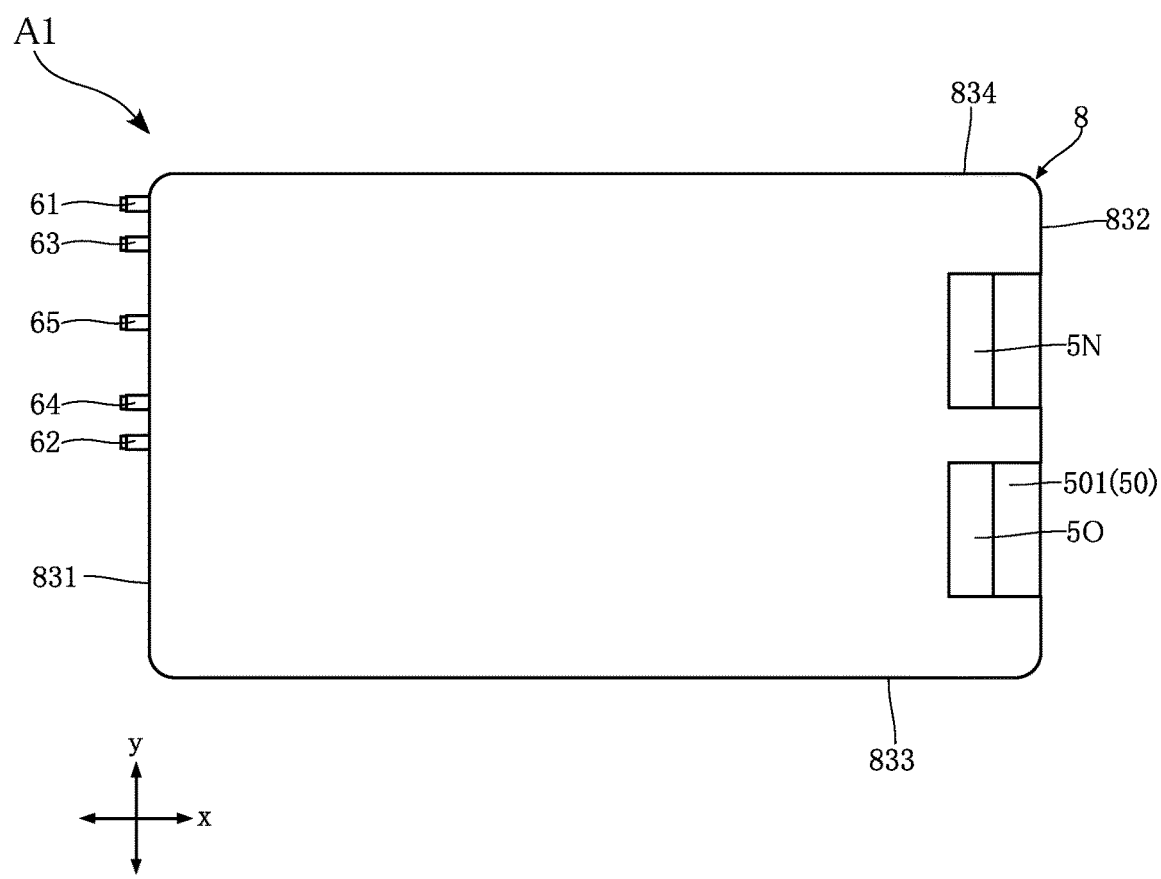
FIG. 3 is a plan view showing the semiconductor device according to the first embodiment.
Figure 4:
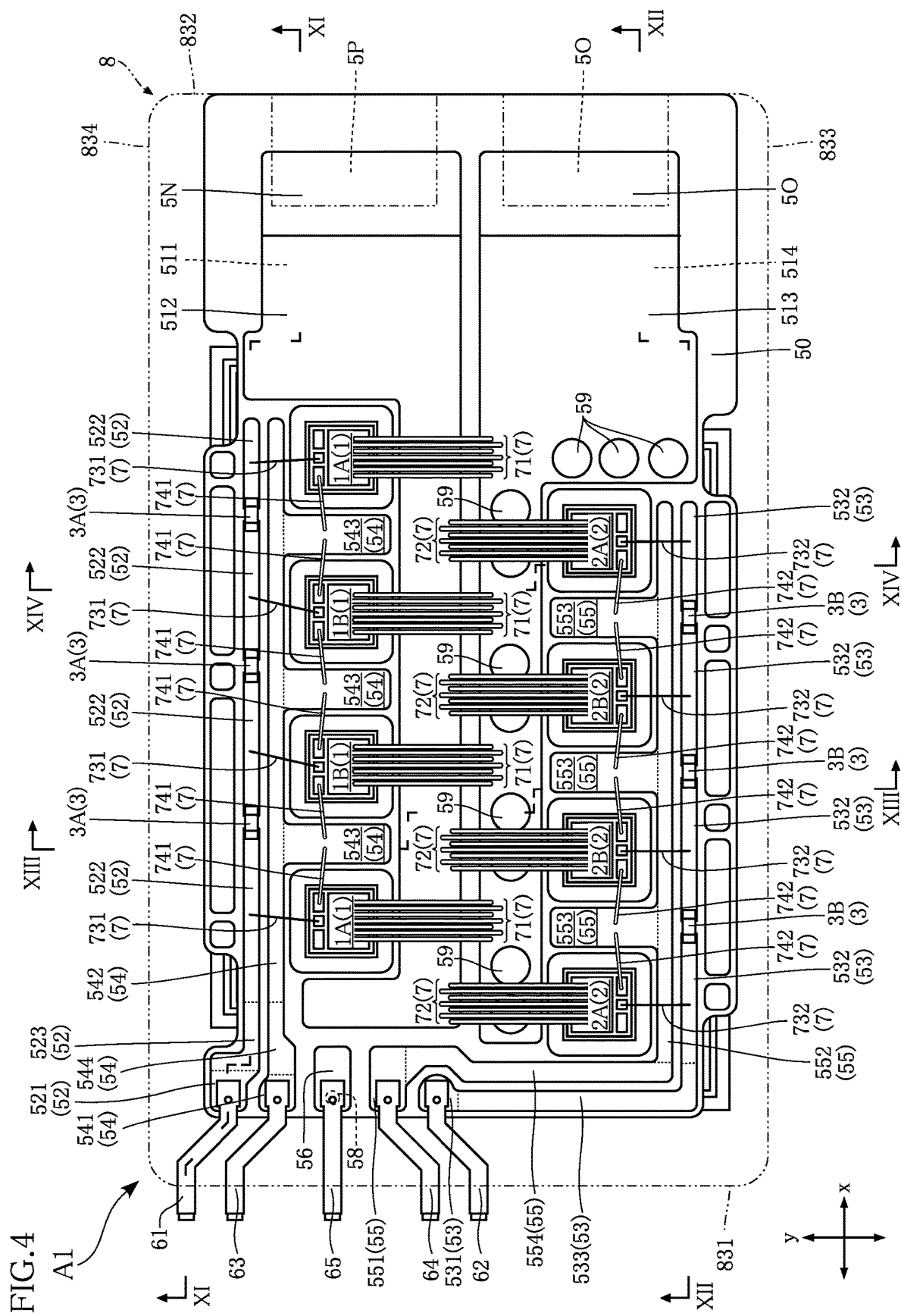
FIG. 4 is a plan view similar to FIG. 3 with the resin member shown in phantom.

FIGS. 1 to 17 show a semiconductor device A1 according to a first embodiment. The semiconductor device A1 includes a plurality of first semiconductor elements 1, a plurality of second semiconductor elements 2, a plurality of circuit components 3, a supporting member 4, an insulating substrate 50, a plurality of power wiring sections 511 to 514, a plurality of signal wiring sections 52 to 56, a pair of control terminals 61 and 62, a plurality of detection terminals 63 to 65, a plurality of connecting members 7, and a resin member 8. The connecting members 7 include connecting members 71, 72, 731, 732, 741, and 742. FIG. 4 shows the resin member 8 with an imaginary line (two-dot chain line).

For convenience of explanation, the thickness direction of each of the first semiconductor elements 1, the second semiconductor elements, and so on is referred to as "thickness direction z". In the following description, "plan view" refers to the view seen in the thickness direction z. A direction perpendicular to the thickness direction z is referred to as "first direction x". The first direction x is, for example, a horizontal direction in the plan view (see FIGS. 3 and 4) of the semiconductor device A1. The direction perpendicular to both of the thickness direction z and the first direction x is referred to as "second direction y". The second direction y is, for example, a vertical direction in the plan view (see FIGS. 3 and 4) of the semiconductor device A1.

In one example, the first semiconductor elements 1 and the second semiconductor elements 2 are MOSFETs. In another example, the first semiconductor elements 1 and the second semiconductor elements 2 may be switching elements other than MOSFETs, such as field effect transistors, including metal-insulator-semiconductor FETs (MISFETs), or bipolar transistors, including IGBTs. Each of the first semiconductor elements 1 and the second semiconductor elements 2 is made of a semiconductor material such as silicon carbide (SiC). The semiconductor material is not limited to SiC, and other examples include silicon (Si), gallium arsenide (GaAs), gallium nitride (GaN), and gallium oxide ($Ga_2O_3$).

Figure 15:
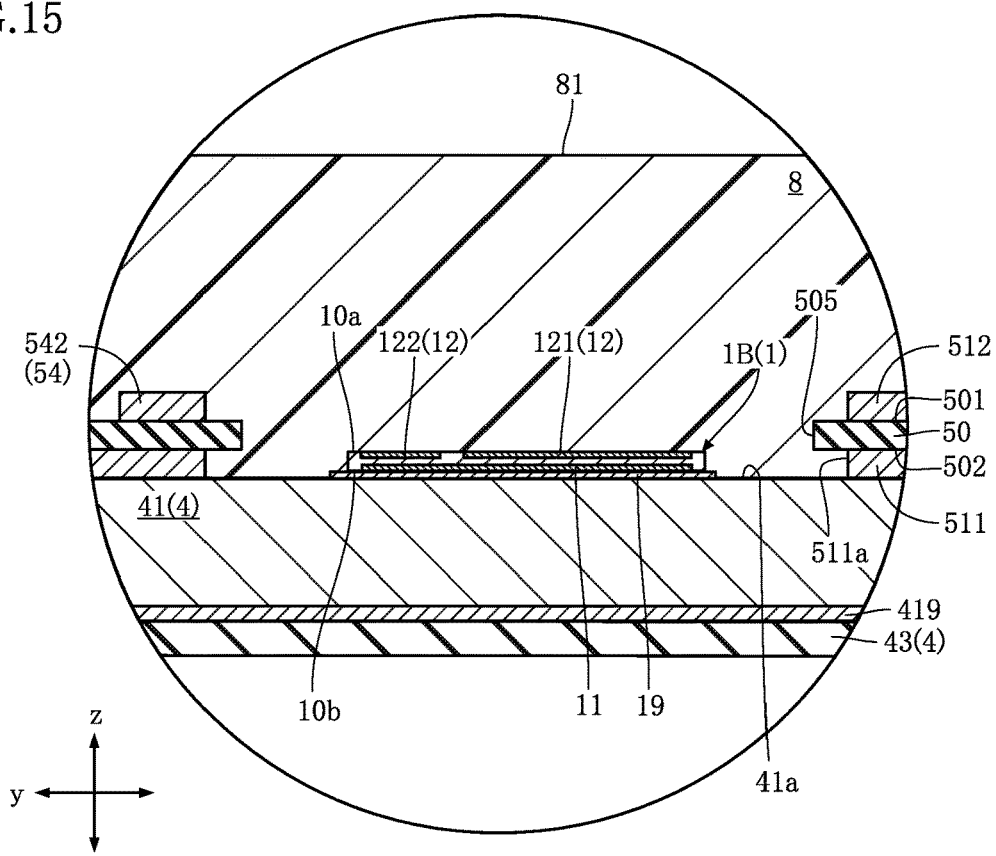
FIG. 15 is an enlarged cross-sectional view showing a part (in the vicinity of a first semiconductor element) of FIG. 14.

As shown in FIG. 15, each of the first semiconductor elements 1 has an element obverse surface 10a and an element reverse surface 10b. The element obverse surface 10a and the element reverse surface 10b are spaced apart from each other in the thickness direction z. The element obverse surface 10a faces in a first sense (upward) of the thickness direction z, and the element reverse surface 10b faces in a second sense (downward) of the thickness direction z. The element obverse surface 10a is an example of a "first-element obverse surface", and the element reverse surface 10b is an example of a "first-element reverse surface".

Figure 5:
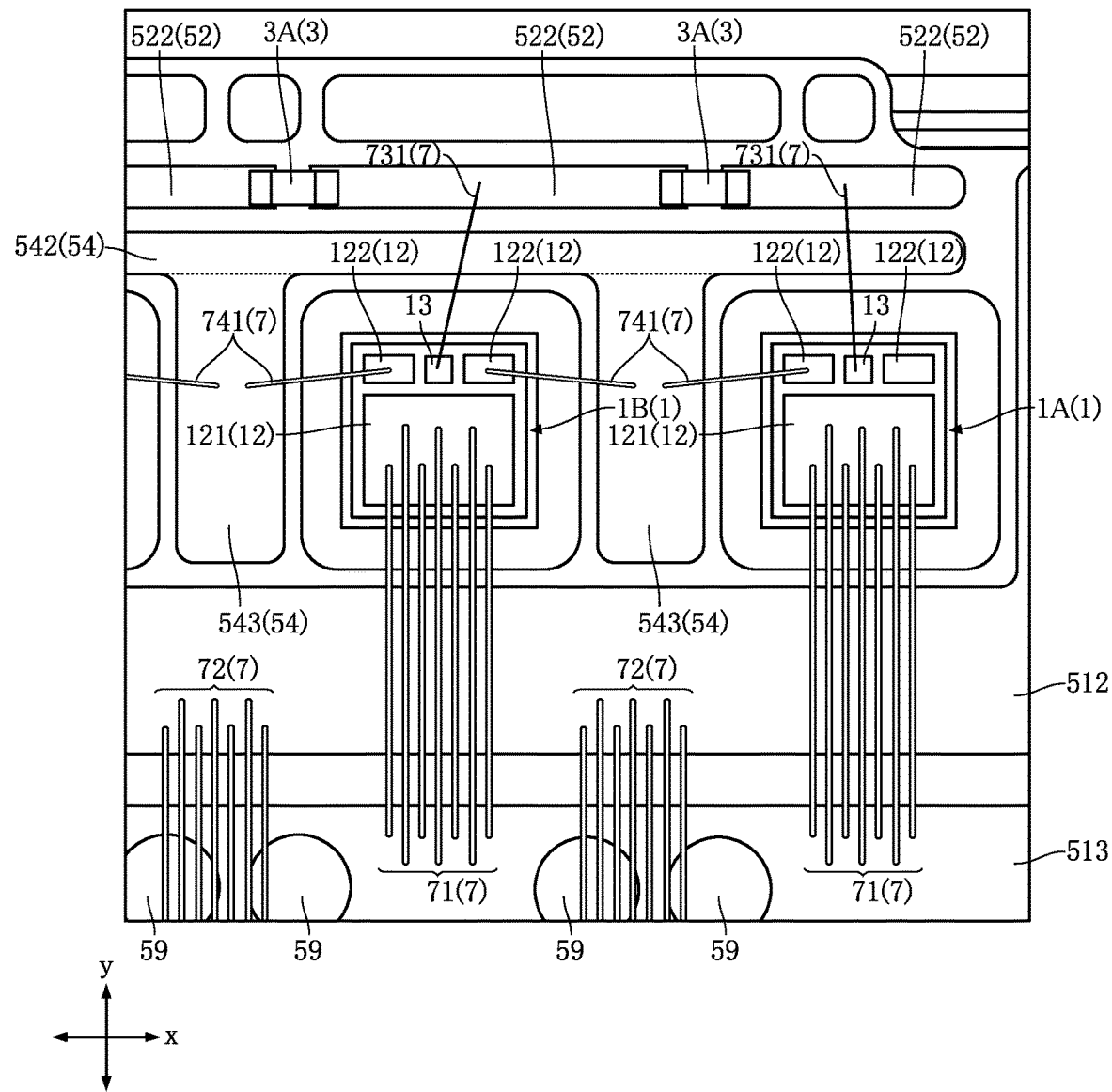
FIG. 5 is an enlarged plan view showing a part (in the vicinity of first semiconductor elements) of FIG. 4.

As shown in FIGS. 5 and 15, each of the first semiconductor elements 1 has a first electrode 11, a second electrode 12, and a third electrode 13. In the example in which each of the first semiconductor elements 1 is a MOSFET, the first electrode 11 is a drain electrode, the second electrode 12 is a source electrode, and the third electrode 13 is a gate electrode. In the semiconductor device A1, the second electrode 12 includes a first power pad 121 and two first detection pads 122. The first power pad 121 is used to conduct the principal current, which will be described more in detail below. Each of the first detection pads 122 is used to detect a first detection signal corresponding to the conducting state of the second electrode 12. The first detection signal is a voltage signal corresponding to the source current flowing through the second electrode 12, for example. Each of the first detection pads 122 is a source sense pad. As shown in FIGS. 5 and 15, in each of the first semiconductor elements 1, the first electrode 11 is arranged on the element reverse surface 10b, and the second electrode 12 (the first power pad 121 and the two first detection pads 122) and the third electrode 13 are arranged on the element obverse surface 10a. As shown in FIG. 5, the first power pad 121, the two first detection pads 122, and the third electrode 13 are spaced apart from each other on the element obverse surface 10a. The two first detection pads 122 flank the third electrode 13 in the first direction x. Unlike the example shown in FIG. 5, the second electrode 12 of each first semiconductor element 1 may be formed by a single pad, instead of including a first power pad 121 and two first detection pads 122.

Figure 17:
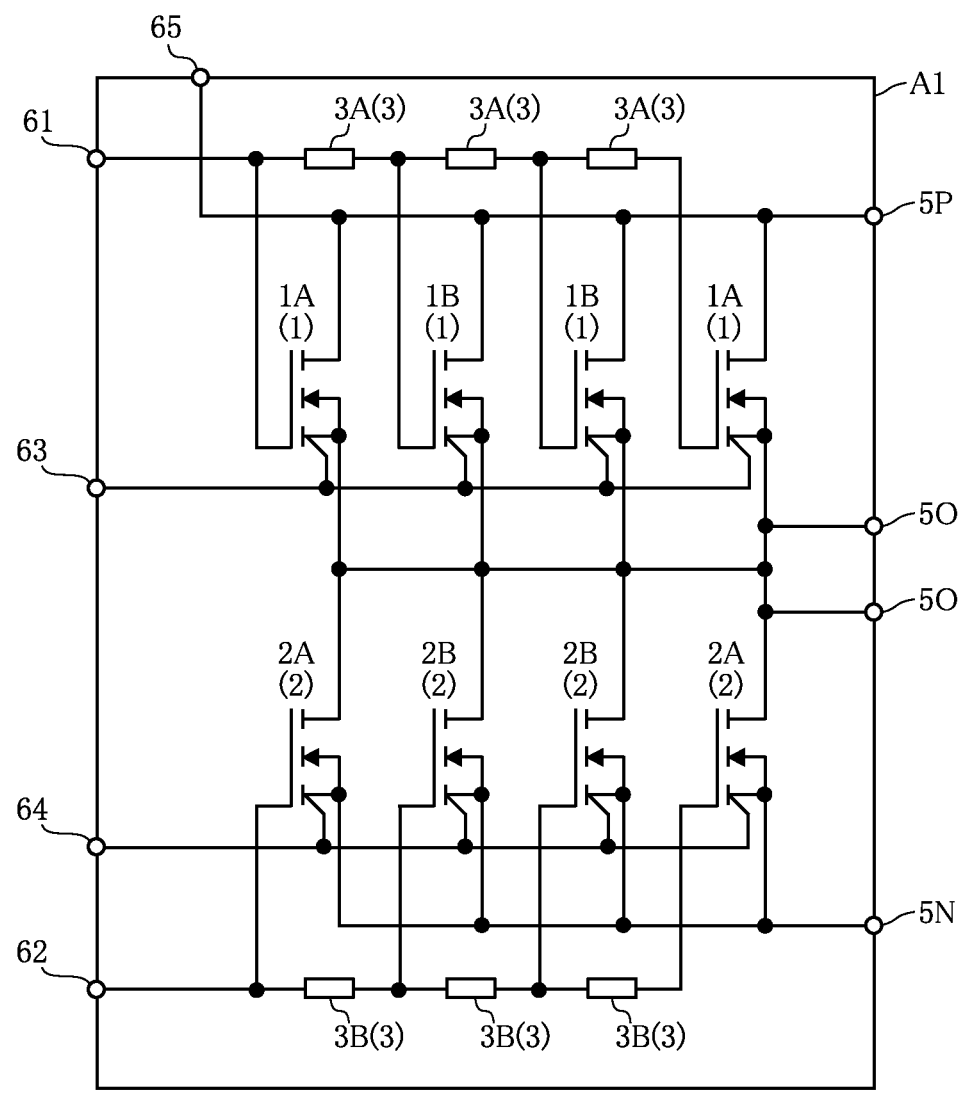
FIG. 17 shows an example of the circuit configuration of the semiconductor device according to the first embodiment.

Each of the first semiconductor elements 1 changes between a conducting state and an insulating state in response to a first drive signal (e.g., gate voltage) inputted to the third electrode 13 (gate electrode). This operation of changing between the conducting state and the insulating state is referred to as a switching operation. In the conducting state, a current flows from the first electrode 11 (drain electrode) to the second electrode 12 (source electrode). In the insulating state, the current does not flow. In other words, each of the first semiconductor elements 1 is controlled to turn on and off the current flow between the first electrode 11 (drain electrode) and the second electrode 12 (source electrode) in response to a first drive signal (e.g., gate voltage) inputted to the third electrode 13 (gate electrode). The switching frequency of each first semiconductor element 1 depends on the frequency of a first drive signal. The first semiconductor elements 1 are configured as described below to electrically connect the first electrodes 11 with each other and the second electrodes 12 with each other. As a result, the first semiconductor elements 1 are electrically connected in parallel, as shown in FIG. 17. The semiconductor device A1 inputs a common first drive signal to the first semiconductor elements 1 connected in parallel, and thereby operates the first semiconductor elements 1 in parallel.

As shown in FIGS. 2, 4, and 7 to 9, the first semiconductor elements 1 are aligned in the first direction x. As shown in FIG. 15, each of the first semiconductor elements 1 is bonded to the supporting member 4 (a conductive plate 41 described below) via a conductive bonding member 19. The conductive bonding member 19 may be solder, metal paste, or sintered metal.

As shown in FIGS. 4, and 7 to 9, the first semiconductor elements 1 include a pair of first outer elements 1A and at least one first inner element 1B. In the example where the semiconductor device A1 includes four first semiconductor elements 1, the first semiconductor elements 1 include two first inner elements 1B. The pair of first outer elements 1A are the first semiconductor elements 1 located at opposite ends in the first direction x. The first inner elements 1B are the first semiconductor elements 1 sandwiched between the pair of first outer elements 1A in the first direction x.

Figure 16:
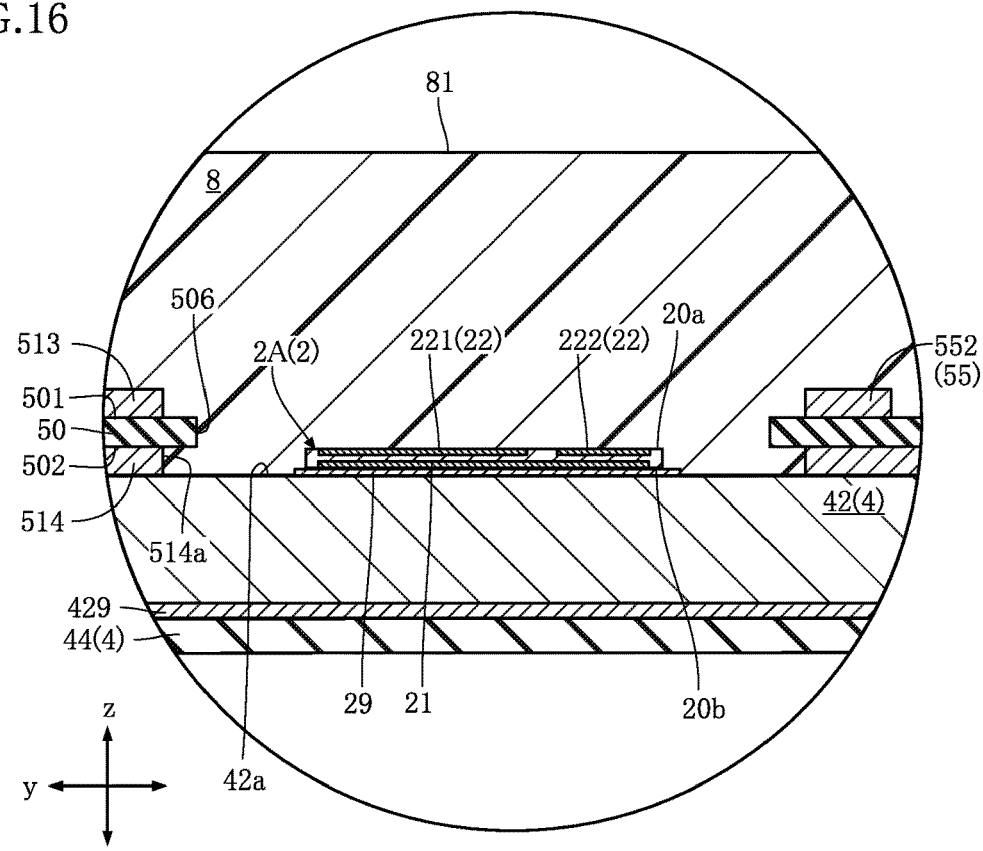
FIG. 16 is an enlarged cross-sectional view showing a part (in the vicinity of a second semiconductor element) of FIG. 14.

As shown in FIG. 16, each of the second semiconductor elements 2 has an element obverse surface 20a and an element reverse surface 20b. The element obverse surface 20a and the element reverse surface 20b are spaced apart from each other in the thickness direction z. The element obverse surface 20a faces in the first sense (upward) of the thickness direction z, and the element reverse surface 20b faces in the second sense (downward) of the thickness direction z. The element obverse surface 20a is an example of a "second-element obverse surface", and the element reverse surface 20b is an example of a "second-element reverse surface".

Figure 6:
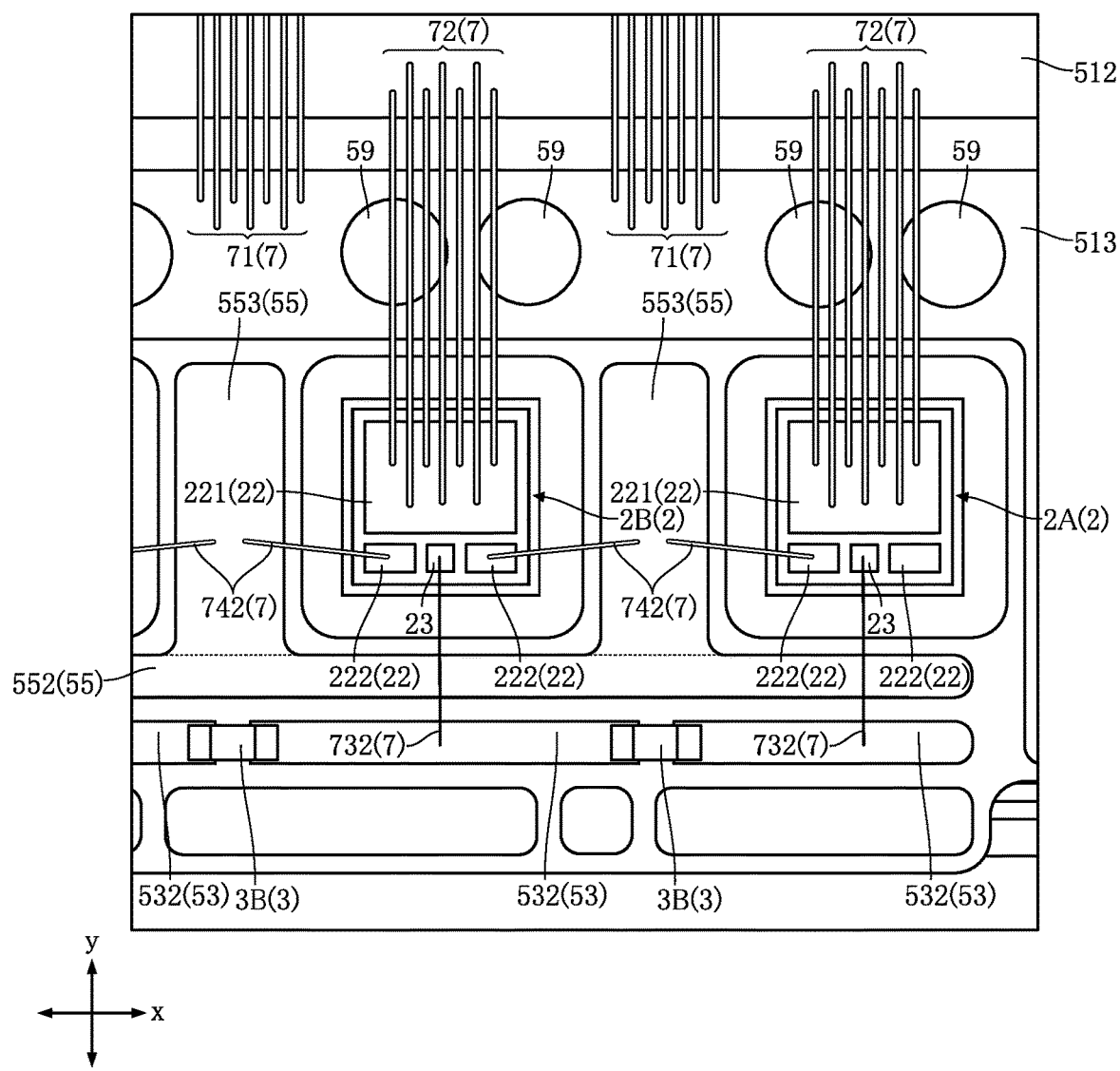
FIG. 6 is an enlarged plan view showing a part (in the vicinity of second semiconductor elements) of FIG. 4.

As shown in FIGS. 6 and 16, each of the second semiconductor elements 2 has a fourth electrode 21, a fifth electrode 22, and a sixth electrode 23. In the example in which each of the second semiconductor elements 2 is a MOSFET, the fourth electrode 21 is a drain electrode, the fifth electrode 22 is a source electrode, and the sixth electrode 23 is a gate electrode. In the semiconductor device A1, the fifth electrode 22 includes a second power pad 221 and two second detection pads 222. The second power pad 221 is used to conduct the principal current, which will be described more in detail below. Each of the second detection pads 222 is used to detect a second detection signal corresponding to the conducting state of the fifth electrode 22. The second detection signal is a voltage signal corresponding to the source current flowing through the fifth electrode 22, for example. Each of the second detection pads 222 is a source sense pad. As shown in FIGS. 6 and 16, in each of the second semiconductor elements 2, the fourth electrode 21 is arranged on the element reverse surface 20b, and the fifth electrode 22 (the second power pad 221 and the two second detection pads 222) and the sixth electrode 23 are arranged on the element obverse surface 20a. As shown in FIG. 6, the second power pad 221, the two second detection pads 222, and the sixth electrode 23 are spaced apart from each other on the element obverse surface 20a. The two second detection pads 222 flank the sixth electrode 23 in the first direction x. Unlike the example shown in FIG. 6, the fifth electrode 22 of each second semiconductor element 2 may be formed by a single pad, instead of including a second power pad 221 and two second detection pads 222.

Each of the second semiconductor elements 2 changes between a conducting state and an insulating state in response to a second drive signal (e.g., gate voltage) inputted to the sixth electrode 23 (gate electrode). This operation of changing between the conducting state and the insulating state is referred to as a switching operation. In the conducting state, a current flows from the fourth electrode 21 (drain electrode) to the fifth electrode 22 (source electrode). In the insulating state, the current does not flow. In other words, each of the second semiconductor elements 2 is controlled to turn on and off the current flow between the fourth electrode 21 (drain electrode) and the fifth electrode 22 (source electrode) in response to a second drive signal (e.g., gate voltage) inputted to the sixth electrode 23 (gate electrode). The switching frequency of each second semiconductor element 2 depends on the frequency of a second drive signal. The second semiconductor elements 2 are configured as described below to electrically connect the fourth electrodes 21 with each other and the fifth electrodes 22 with each other. As a result, the second semiconductor elements 2 are electrically connected in parallel, as shown in FIG. 17. The semiconductor device A1 inputs a common second drive signal to the second semiconductor elements 2 connected in parallel, and thereby operates the second semiconductor elements 2 in parallel.

As shown in FIGS. 2, 4, and 7 to 9, the second semiconductor elements 2 are aligned in the first direction x. As shown in FIG. 16, each of the second semiconductor elements 2 is bonded to the supporting member 4 (a conductive plate 42 described below) via a conductive bonding member 29. The conductive bonding member 29 may be solder, metal paste, or sintered metal.

As shown in FIGS. 4, and 7 to 9, the second semiconductor elements 2 include a pair of second outer elements 2A and at least one second inner element 2B. In the example where the semiconductor device A1 includes four second semiconductor elements 2, the second semiconductor elements 2 include two second inner elements 2B. The pair of second outer elements 2A are the second semiconductor elements 2 located at opposite ends in the first direction x. The second inner elements 2B are the second semiconductor elements 2 sandwiched between the pair of second outer elements 2A in the first direction x.

The semiconductor device A1 may be configured as a half-bridge switching circuit, for example. The first semiconductor elements 1 are connected in parallel as described above, and form an upper arm circuit of the semiconductor device A1. The second semiconductor elements 2 are connected in parallel as described above, and form a lower arm circuit of the semiconductor device A1. Each of the first semiconductor elements 1 is connected in series with one of the second semiconductor elements 2 by electrically connecting the second electrode 12 (source electrode) and the fourth electrode 21 (drain electrode). With this serial connection, the first semiconductor elements 1 and the second semiconductor elements 2 form a bridge. In the illustrated example, the semiconductor device A1 includes four first semiconductor elements 1 and four second semiconductor elements 2 (see FIG. 4). The numbers of the first semiconductor elements 1 and the second semiconductor elements 2 to be provided are not limited to this example, and may be changed appropriately depending on the desired performance of the semiconductor device A1.

The circuit components 3 are arranged on the insulating substrate 50. In the semiconductor device A1, each of the circuit components 3 is a ferrite bead. The ferrite bead is an inductance element, and increases the impedance of a high frequency signal (current) rather than that of a low frequency signal. Each of the circuit components 3 is of a surface-mounting type in the illustrated example, but may be of a lead type instead of the surface-mounting type in another example. As shown in FIGS. 4 and 15, the circuit components 3 include a plurality of first circuit components 3A and a plurality of second circuit components 3B.

The first circuit components 3A are connected to a first conductive member. The first conductive member is electrically connected to the control terminal 61, and is electrically interposed between the third electrodes 13 of the first semiconductor elements 1. The first conductive member is a transmission path for a first drive signal. The first conductive member may include a portion of the signal wiring section 52 and the connecting members 731, for example. The third electrodes 13 of the first semiconductor elements 1 are electrically connected to each other via at least one of the first circuit components 3A. The first circuit components 3A increase the impedance in a first frequency band. The first frequency band is greater than the switching frequency of each first semiconductor element 1. The first frequency band includes, for example, the resonance frequency of a resonance circuit that is formed by including the parasitic inductance of the first conductive member. In the semiconductor device A1, the resonance circuit further includes the parasitic capacitance (drain-gate capacitance) of each first semiconductor element 1.

The second circuit components 3B are connected to a second conductive member. The second conductive member is electrically connected to the control terminal 62, and is electrically interposed between the sixth electrodes 23 of the second semiconductor elements 2. The second conductive member is a transmission path for a second drive signal. The second conductive member may include a portion of the signal wiring section 53 and the connecting members 732, for example. The sixth electrodes 23 of the second semiconductor elements 2 are electrically connected to each other via at least one of the second circuit components 3B. The second circuit components 3B increase the impedance in a second frequency band. The second frequency band is greater than the switching frequency of each second semiconductor element 2. The second frequency band includes, for example, the resonance frequency of a resonance circuit that is formed by including the parasitic inductance of the second conductive member. In the semiconductor device A1, the resonance circuit further includes the parasitic capacitance (drain-gate capacitance) of each second semiconductor element 2.

In the present embodiment, the switching frequency of each first semiconductor element 1 is the same as the switching frequency of each second semiconductor element 2, and the first circuit components 3A are of the same type as the second circuit components 3B. Thus, the first frequency band is the same as the second frequency band. Note that even when the switching frequency of each first semiconductor element 1 is the same as the switching frequency of each second semiconductor element 2, the first frequency band may be different from the second frequency band. Furthermore, when the switching frequency of each first semiconductor element 1 is different from the switching frequency of each second semiconductor element 2, the first frequency band and the second frequency band may be the same or may be different from each other.

As shown in FIGS. 9, and 14 to 16, the supporting member 4 supports the first semiconductor elements 1 and the second semiconductor elements 2. As shown in FIGS. 9, and 11 to 16, the supporting member 4 has a pair of conductive plates 41 and 42, and a pair of insulating plates 43 and 44.

Figure 9:
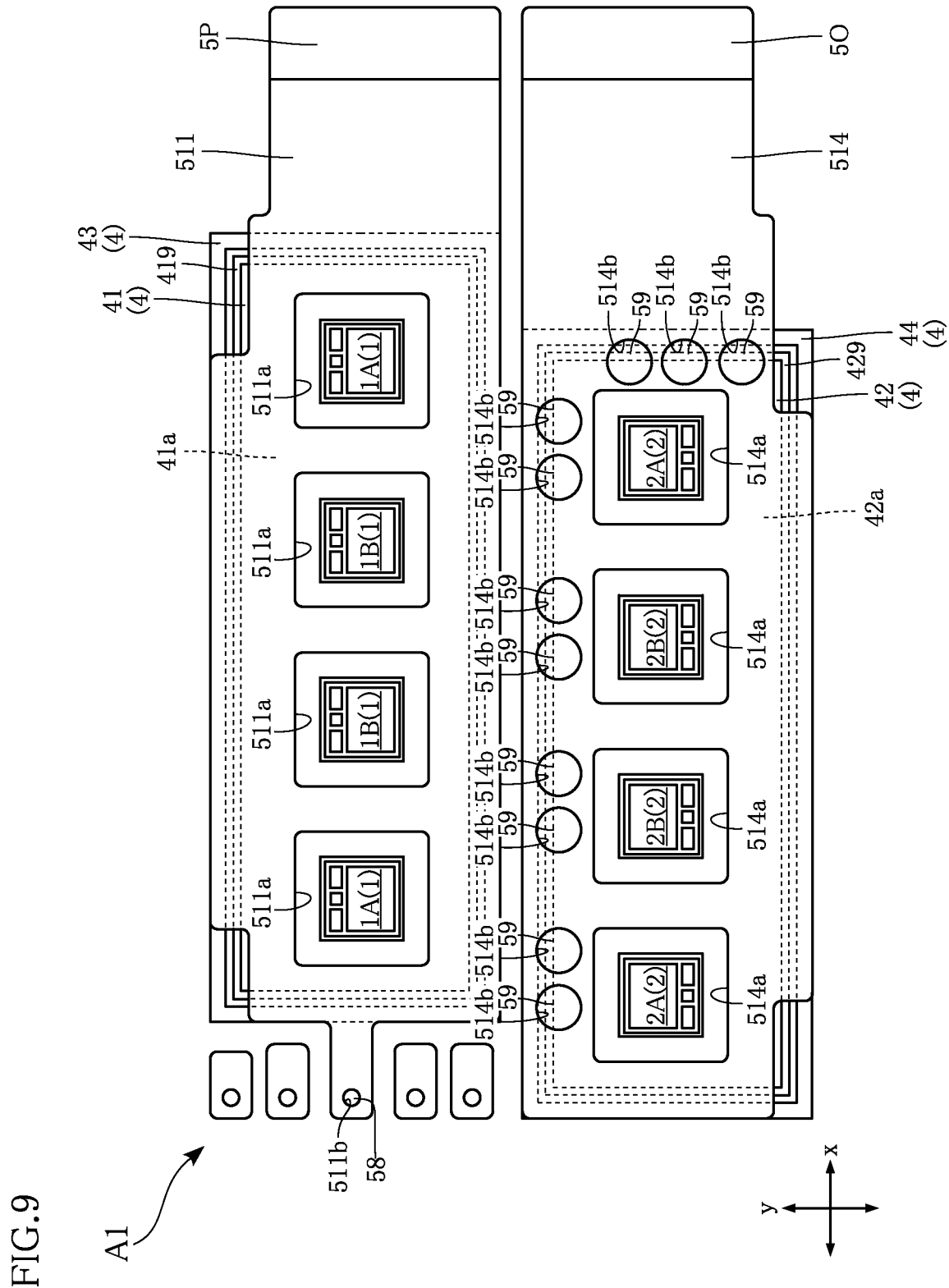
FIG. 9 is a plan view similar to FIG. 8 but omitting an insulating substrate.

Each of the pair of conductive plates 41 and 42 is made of an electrically conductive material, such as copper or a copper alloy. Alternatively, each of the conductive plates 41 and 42 may be a laminate in which a copper layer and a molybdenum layer are alternately stacked in the thickness direction z. In this case, the surface layers of each of the conductive plates 41 and 42 in the thickness direction z are copper layers. As shown in FIG. 9, each of the conductive plates 41 and 42 has a rectangular shape in plan view.

Figure 14:
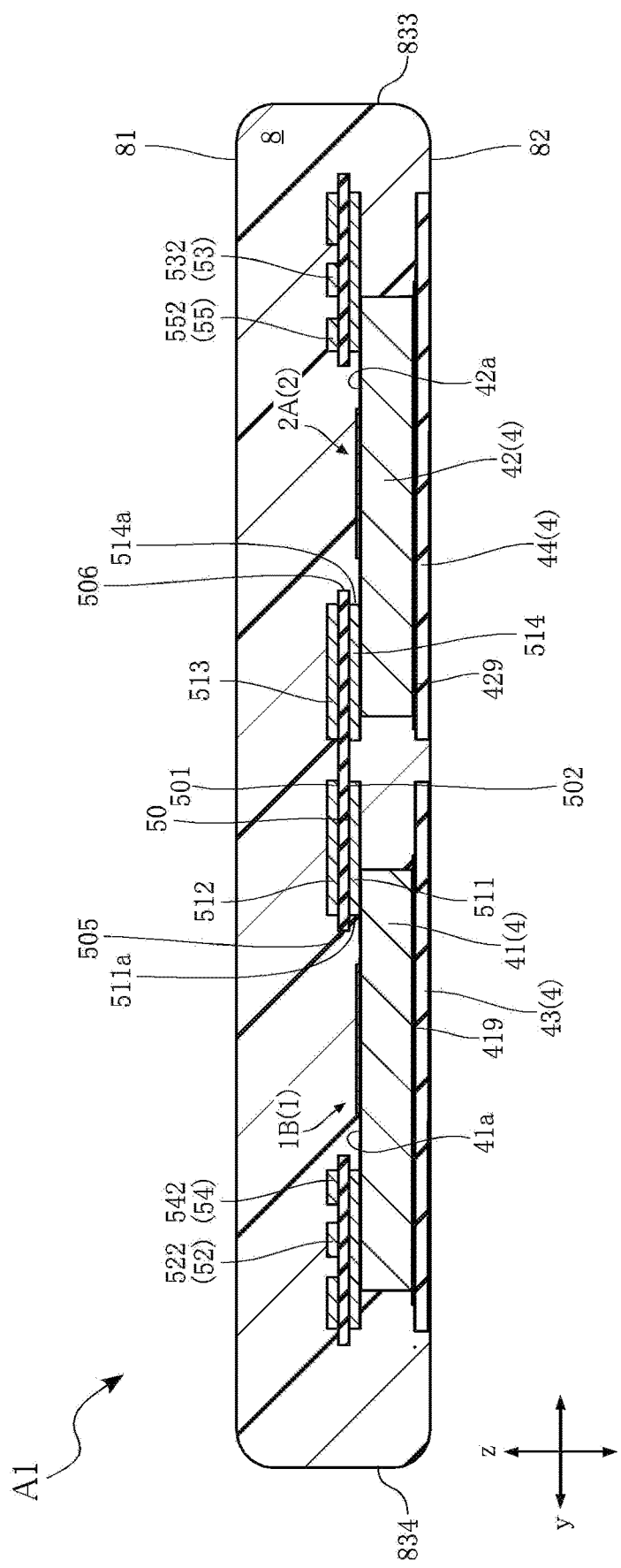
FIG. 14 is a cross-sectional view taken along line XIV-XIV in FIG. 4.

As shown in FIGS. 9, 14, and 15, the conductive plate 41 supports the first semiconductor elements 1 mounted thereon. The conductive plate 41 is electrically connected to the first electrodes 11 (drain electrodes) of the first semiconductor elements 1. The first electrodes 11 of the first semiconductor elements 1 are electrically connected to each other via the conductive plate 41. The conductive plate 41 has a rectangular parallelepiped shape, for example. The dimension of the conductive plate 41 in the thickness direction z is larger than the dimension of the insulating substrate 50 in the thickness direction z. The conductive plate 41 is an example of a "first mounting portion".

As shown in FIGS. 9, 14 and 15, the conductive plate 41 has a mounting surface 41a. The mounting surface 41a faces in the first sense (upward) of the thickness direction z. The first semiconductor elements 1 and the power wiring section 511 are bonded to the mounting surface 41a. As shown in FIGS. 14 and 15, the conductive plate 41 is bonded to the insulating plate 43 via a bonding member 419. The bonding member 419 may be electrically conductive or insulating.

As shown in FIGS. 9, 14 and 16, the conductive plate 42 supports the second semiconductor elements 2 mounted thereon. The conductive plate 42 is electrically connected to the fourth electrodes 21 (drain electrodes) of the second semiconductor elements 2. The fourth electrodes 21 of the second semiconductor elements 2 are electrically connected to each other via the conductive plate 42. The conductive plate 42 has a rectangular parallelepiped shape, for example. The dimension of the conductive plate 42 in the thickness direction z is larger than the dimension of the insulating substrate 50 in the thickness direction z. The conductive plate 42 is an example of a "second mounting portion".

As shown in FIGS. 9, 14 and 16, the conductive plate 42 has a mounting surface 42a. The mounting surface 42a faces in the first sense (upward) of the thickness direction z. The second semiconductor elements 2 and the power wiring section 514 are bonded to the mounting surface 42a. As shown in FIGS. 14 and 16, the conductive plate 42 is bonded to the insulating plate 44 via a bonding member 429. The bonding member 429 may be electrically conductive or insulating.

Each of the pair of insulating plates 43 and 44 is made of an insulating material, such as aluminum oxide ($Al_2O_3$). As shown in FIG. 9, each of the insulating plates 43 and 44 has a rectangular shape in plan view. As shown in FIGS. 9, 14 and 15, the insulating plate 43 supports the conductive plate 41. As shown in FIGS. 9, 14 and 16, the insulating plate 44 supports the conductive plate 42. The surface of each of the insulating plates 43 and 44 to which the conductive plate 41 or 42 is bonded may be covered with a plating layer. The plating layer may be made of silver or a silver alloy. In the example shown in FIG. 10, the surface of each of the insulating plates 43 and 44 that faces in the second sense (downward) of the thickness direction z is exposed from the resin member 8 (a resin reverse surface 82 described below); however, said surface may be covered with the resin member 8 in another example.

The insulating substrate 50 is made of an insulating material, which is glass epoxy resin in one example. In another example, the insulating substrate 50 may be made of a ceramic material, such as aluminum nitride (AlN), silicon nitride (SiN) or $Al_2O_3$, instead of glass epoxy resin.

As shown in FIGS. 11 to 16, the insulating substrate 50 has an obverse surface 501 and a reverse surface 502. The obverse surface 501 and the reverse surface 502 are spaced apart from each other in the thickness direction z. The obverse surface 501 faces in the first sense (upward) of the thickness direction z, and the reverse surface 502 faces in the second sense (downward) of the thickness direction z. The obverse surface 501 is an example of a "substrate obverse surface", and the reverse surface 502 is an example of a "substrate reverse surface".

As shown in FIGS. 8, and 13 to 16, the insulating substrate 50 includes a plurality of through-holes 503, a through-hole 504, a plurality of openings 505, and a plurality of openings 506.

Figure 8:
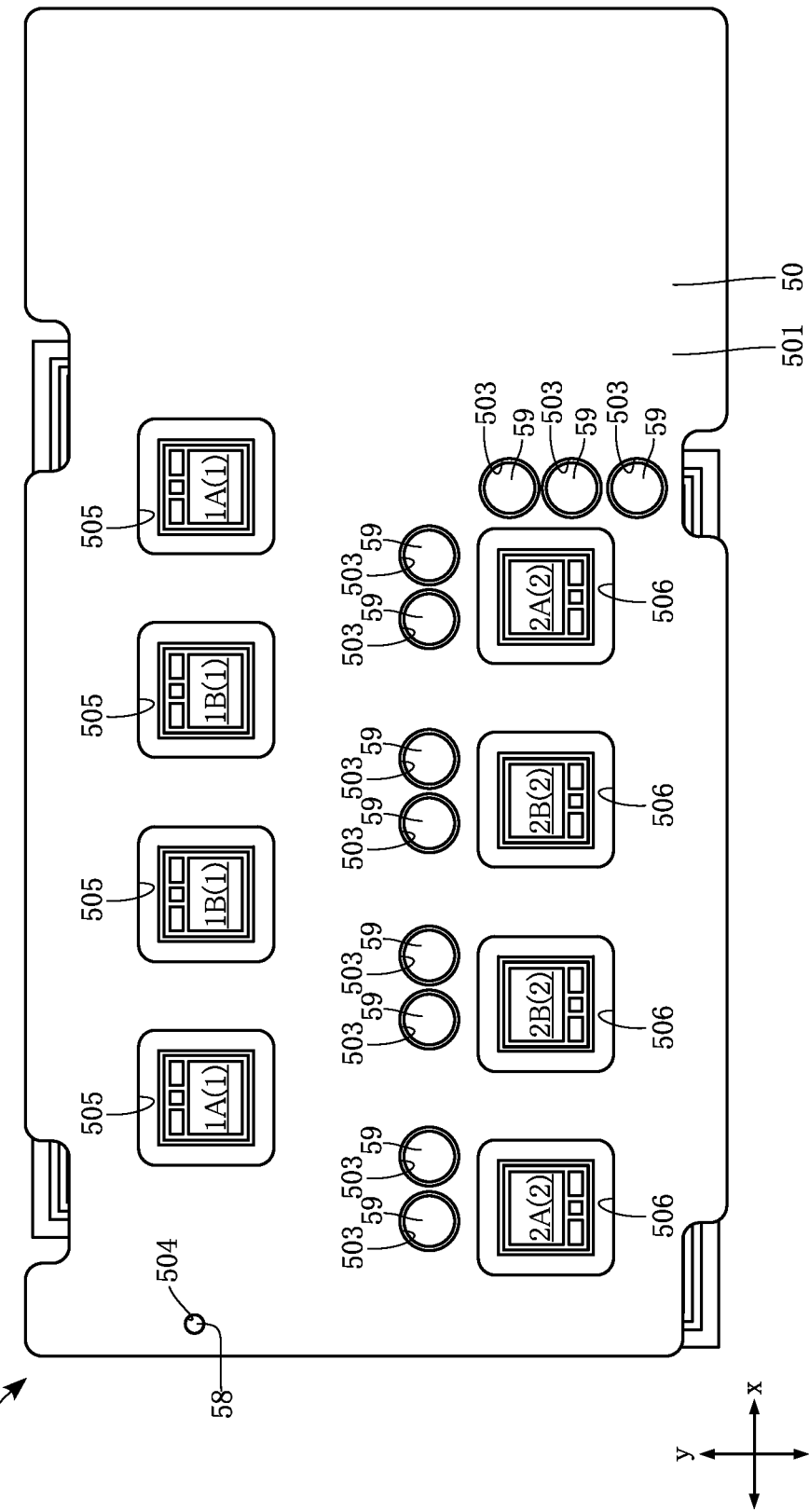
FIG. 8 is a plan view similar to FIG. 7 but omitting some power wiring sections and a plurality of signal wiring sections.
Figure 13:
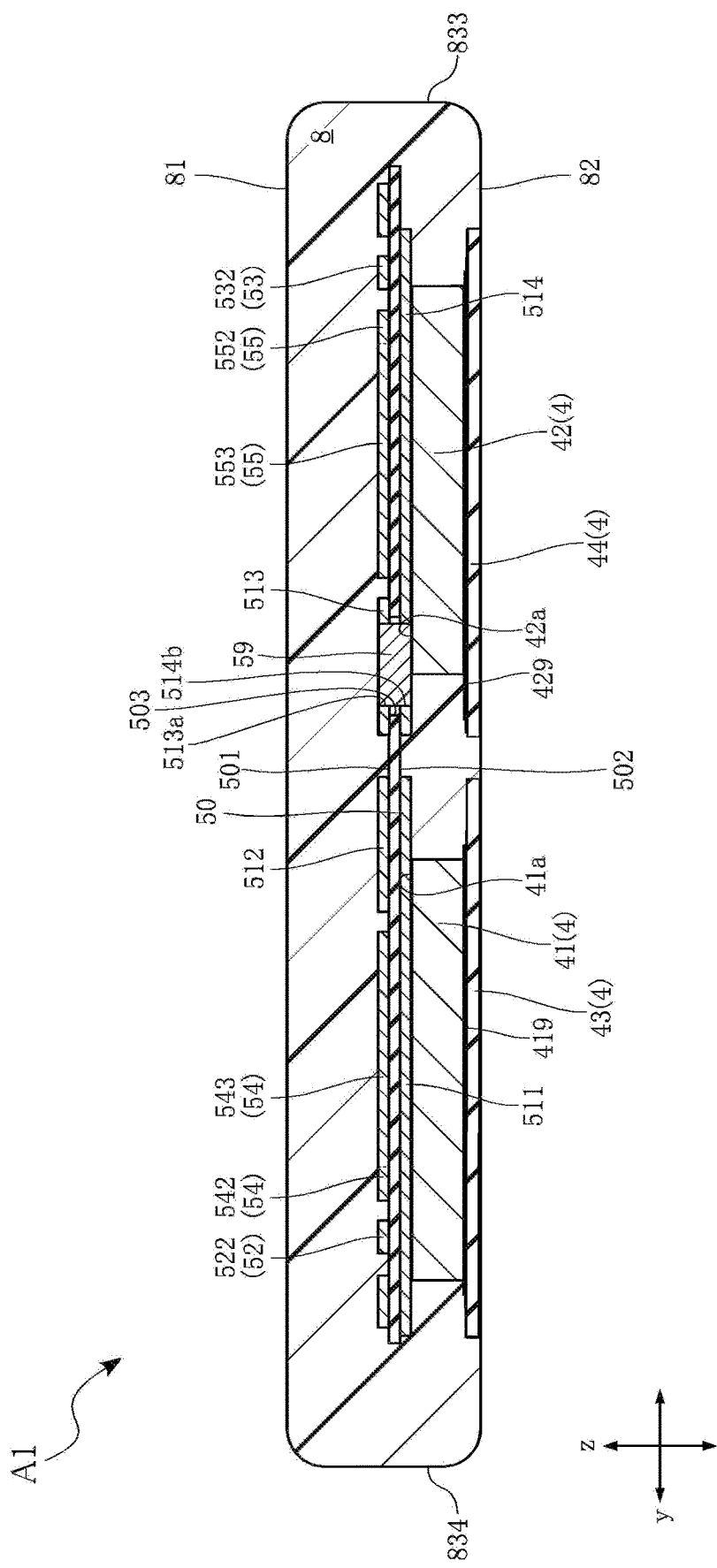
FIG. 13 is a cross-sectional view taken along line XIII-XIII in FIG. 4.

As shown in FIG. 13, the through-holes 503 penetrate through the insulating substrate 50 from the obverse surface 501 to the reverse surface 502 in the thickness direction z. As shown in FIGS. 8 and 13, a metal member 59 is inserted in each of the through-holes 503. As shown in FIGS. 8 and 13, the inner surface of each of the through-holes 503 is not in contact with the metal member 59. Unlike this configuration, the inner surface of each of the through-holes 503 may be in contact with the metal member 59. In the present disclosure, the phrase that a component (e.g., a metal member 59) is "inserted in" a through-hole (e.g., a through-hole 503) refers to a state in which the component is placed inside the through-hole without specifying whether or not the component is in contact with the inner surface of the through-hole. Note that an insulating member different from the insulating substrate 50 may be present in a clearance between a metal member 59 and a through-hole 503.

The through-hole 504 penetrates through the insulating substrate 50 from the obverse surface 501 to the reverse surface 502 in the thickness direction z. As shown in FIG. 8, a metal member 58 is inserted in the through-hole 504. In the illustrated example, the inner surface of the through-hole 504 is in contact with the metal member 58 (see FIG. 8). In another example, however, the inner surface of the through-hole 504 may not be in contact with the metal member 58.

As shown in FIGS. 14 and 15, the openings 505 penetrate through the insulating substrate 50 from the obverse surface 501 to the reverse surface 502 in the thickness direction z. As shown in FIG. 8, each of the openings 505 surrounds one of the first semiconductor elements 1 in plan view. Each of the openings 505 is an example of a "first opening".

As shown in FIGS. 14 and 16, the openings 506 penetrate through the insulating substrate 50 from the obverse surface 501 to the reverse surface 502 in the thickness direction z. As shown in FIG. 8, each of the openings 506 surrounds one of the second semiconductor elements 2 in plan view. Each of the openings 506 is an example of a "second opening".

The power wiring sections 511 to 514 and the signal wiring sections 52 to 56 form conduction paths in the semiconductor device A1, together with portions (the conductive plates 41 and 42) of the supporting member 4, the metal members 58 and 59, and the connecting members 7. The power wiring sections 511 to 514 and the signal wiring sections 52 to 56 are spaced apart from each other. The power wiring sections 511 to 514 and the signal wiring sections 52 to 56 are made of copper or a copper alloy, for example. The thickness (the dimension in the thickness direction z) and material of each of the power wiring sections 511 to 514 and the signal wiring sections 52 to 56 may be changed as necessary, depending on the specifications of the semiconductor device A1 (e.g., the rated current, the allowable current, the rated voltage, the withstand voltage, the internal inductance of the device as a whole, the device size, and so on).

The power wiring sections 511 to 514 form the conduction paths of the principal current in the semiconductor device A1. In plan view, the power wiring section 511 and the power wiring section 512 of the semiconductor device A1 overlap with each other, and the power wiring section 513 and the power wiring section 514 overlap with each other.

The power wiring section 511 is formed on the reverse surface 502 of the insulating substrate 50. As shown in FIGS. 9, 11, and 13 to 15, the power wiring section 511 is bonded to the mounting surface 41a of the conductive plate 41. The power wiring section 511 is electrically connected to the first electrodes 11 (drain electrodes) of the first semiconductor elements 1 via the conductive plate 41.

As shown in FIGS. 9, 14 and 15, the power wiring section 511 includes a plurality of openings 511a and a through-hole 511b. As shown in FIGS. 14 and 15, the openings 511a penetrate through the power wiring section 511 in the thickness direction z. As can be seen from FIGS. 14 and 15, each of the openings 511a overlaps with one of the openings 505 of the insulating substrate 50 in plan view. As shown in FIG. 9, each of the openings 511a surrounds one of the first semiconductor elements 1 in plan view. The through-hole 511b penetrates through the power wiring section 511 in the thickness direction z. As shown in FIG. 9, the metal member 58 is fitted in the through-hole 511b, and the inner surface of the through-hole 511b is in contact with the metal member 58. In the present disclosure, the phrase that a component (e.g., the metal member 58) is "fitted in" a through-hole (e.g., the through-hole 511b) refers to a state in which the component is placed inside the through-hole and in contact with the inner surface of the through-hole. In other words, the state of a component being "fitted in" a through-hole corresponds to one state of the component being "inserted in" the through-hole, where the component is in contact with the inner surface of the through-hole.

The power wiring section 512 is formed on the obverse surface 501 of the insulating substrate 50. As can be seen from FIGS. 4 and 6, the power wiring section 512 is electrically connected to the fifth electrodes 22 (source electrodes) of the second semiconductor elements 2 via the connecting members 72. In plan view, the power wiring section 512 is formed to avoid the first semiconductor elements 1.

The power wiring section 513 is formed on the obverse surface 501 of the insulating substrate 50. The power wiring section 513 is located in a first sense (downward in FIG. 6) of the second direction y from the power wiring section 512 in plan view. As can be seen from FIGS. 4 and 5, the power wiring section 513 is electrically connected to the second electrodes 12 (source electrodes) of the first semiconductor elements 1 via the connecting members 71. Furthermore, the power wiring section 513 has the configuration described below, and is thereby also electrically connected to the fourth electrodes 21 (drain electrodes) of the second semiconductor elements 2 via the power wiring section 514 and the metal members 59. In plan view, the power wiring section 513 is formed to avoid the second semiconductor elements 2.

Figure 7:
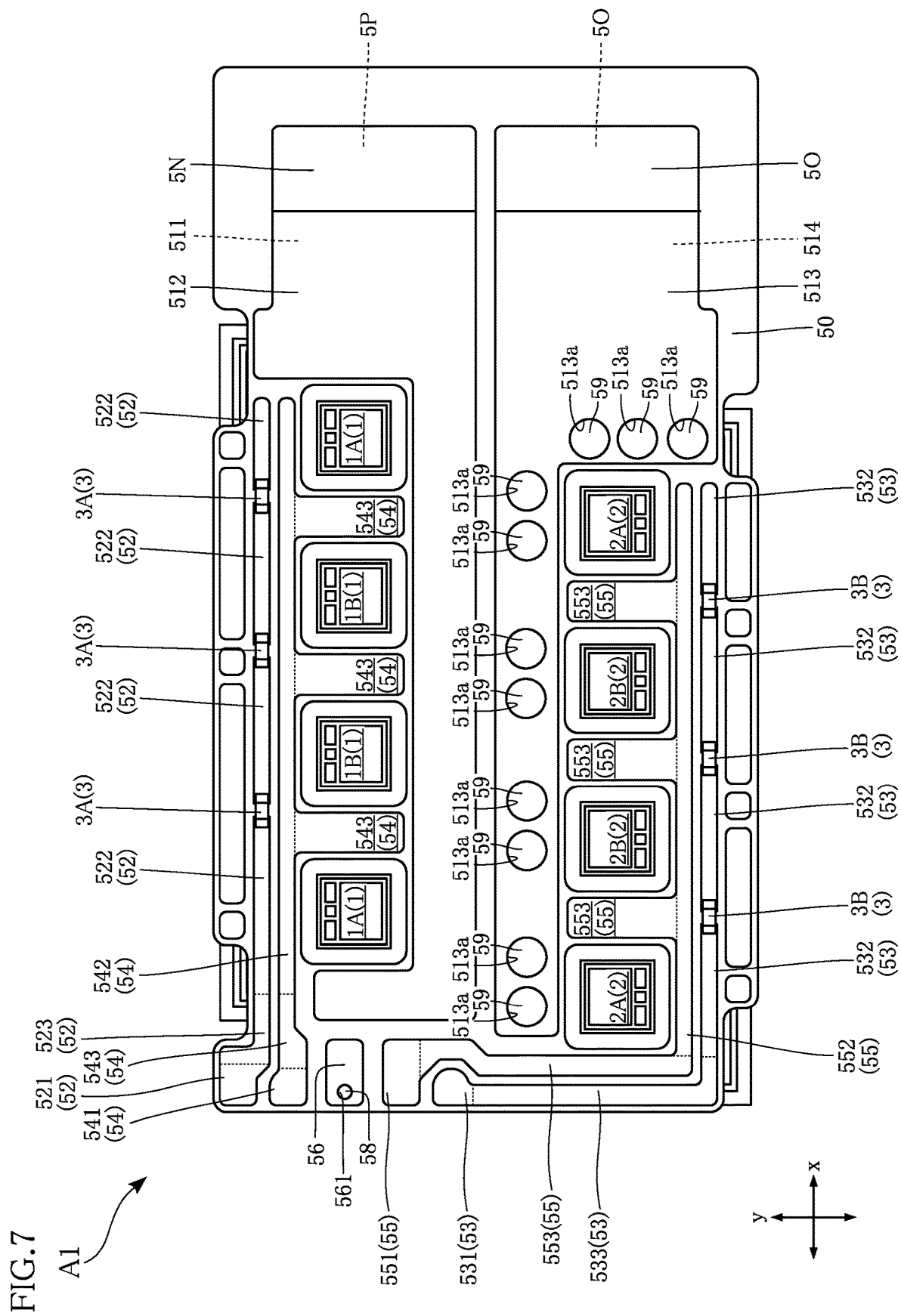
FIG. 7 is a plan view similar to FIG. 4 but omitting a plurality of control terminals, a plurality of detection terminals, a plurality of connecting members, and a resin member.

As shown in FIGS. 7 and 13, the power wiring section 513 includes a plurality of through-holes 513a. As shown in FIG. 13, the through-holes 513a penetrate through the power wiring section 513 in the thickness direction z. As shown in FIGS. 7 and 13, each of the metal members 59 is fitted in one of the through-holes 513a, and the inner surface of the through-hole 513a is in contact with the metal member 59. In the illustrated example, each of the through-holes 513a has a circular shape in plan view (see FIG. 7). In a different example, the shape of each through-hole 513a may be changed appropriately according to the shape of each metal member 59.

The power wiring section 514 is formed on the reverse surface 502 of the insulating substrate 50. As shown in FIGS. 9, 12 to 14, and 16, the power wiring section 514 is bonded to the mounting surface 42a of the conductive plate 42. The power wiring section 514 is electrically connected to the fourth electrodes 21 (drain electrodes) of the second semiconductor elements 2 via the conductive plate 42. Furthermore, the power wiring section 514 has the configuration described below, and is thereby also electrically connected to the second electrodes 12 (source electrodes) of the first semiconductor elements 1 via the power wiring section 513 and the metal members 59.

As shown in FIGS. 9, 13, 14, and 16, the power wiring section 514 includes a plurality of openings 514a and a plurality of through-holes 514b. As shown in FIGS. 14 and 16, the openings 514a penetrate through the power wiring section 514 in the thickness direction z. As can be seen from FIGS. 14 and 16, each of the openings 514a overlaps with one of the openings 506 of the insulating substrate 50 in plan view. As shown in FIG. 9, each of the openings 514a surrounds one of the second semiconductor elements 2 in plan view. As shown in FIG. 13, the openings 514b penetrate through the power wiring section 514 in the thickness direction z. As can be seen from FIG. 13, each of the through-holes 514b overlaps with one of the through-holes 513a of the power wiring section 513 in plan view. Each of the metal members 59 is fitted in one of the through-holes 514b.

The semiconductor device A1 includes a first power terminal portion 5P, a second power terminal portion 5N, and two third power terminal portions 5O. The first power terminal portion 5P and the second power terminal portion 5N are connected to an external direct-current power source that applies a source voltage (direct-current voltage) to the terminal portions. In the semiconductor device A1, the first power terminal portion 5P is a P terminal connected to the positive electrode of the direct-current power source, and the second power terminal portion 5N is an N terminal connected to the negative electrode of the direct-current power source. The direct-current voltage applied to the first power terminal portion 5P and the second power terminal portion 5N is converted to alternating-current voltage by the switching operations of the first semiconductor elements 1 and the second semiconductor elements 2. The converted voltage (alternating-current voltage) is outputted from the two third power terminal portions 5O. The principal current in the semiconductor device A1 is generated by the source voltage and the converted voltage.

As shown in FIGS. 4, 7, and 9 to 11, the first power terminal portion 5P is a part of the power wiring section 511. Accordingly, the power wiring section 511 includes the first power terminal portion 5P. As shown in FIGS. 4, 7, and 9 to 11, the first power terminal portion 5P is located at the end of the power wiring section 511 in a first sense (right side in FIG. 4) of the first direction x. Being a part of the power wiring section 511, the first power terminal portion 5P is electrically connected to the first electrodes 11 (drain electrodes) of the first semiconductor elements 1.

As shown in FIGS. 2 to 4, 7 and 11, the second power terminal portion 5N is a part of the power wiring section 512. Accordingly, the power wiring section 512 includes the second power terminal portion 5N. As shown in FIGS. 2 to 4, 7 and 11, the second power terminal portion 5N is located at the end of the power wiring section 512 in the first sense (right side in FIG. 4) of the first direction x. Being a part of the power wiring section 512, the second power terminal portion 5N is electrically connected to the fifth electrodes 22 (source electrodes) of the second semiconductor elements 2.

As shown in FIGS. 2 to 4, 7 and 12, one of the two third power terminal portions 5O is a part of the power wiring section 513. Accordingly, the power wiring section 513 includes the one of the two third power terminal portions 5O. As shown in FIGS. 2 to 4, 7 and 12, the one of the two third power terminal portions 5O is located at the end of the power wiring section 513 in the first sense (right side in FIG. 4) of the first direction x. As shown in FIGS. 4, 7, 9, 10, and 12, the other one of the two third power terminal portions 5O is a part of the power wiring section 514. Accordingly, the power wiring section 514 includes the other of the two third power terminal portions 5O. As shown in FIGS. 4, 7, 9, 10, and 12, the other of the two third power terminal portions 5O is located at the end of the power wiring section 514 in the first sense (right side in FIG. 4) of the first direction x. Being a part of either the power wiring section 513 or the power wiring section 514, each of the third power terminal portions 5O is electrically connected to the second electrodes 12 (source electrodes) of the first semiconductor elements 1 and the fourth electrodes 21 (drain electrodes) of the second semiconductor elements 2.

The first power terminal portion 5P, the second power terminal portion 5N, and the two third power terminal portions 5O are spaced apart from each other, and are exposed from the resin member 8 as shown in FIGS. 1, 3, and 10 to 12. The surface of each of the first power terminal portion 5P, the second power terminal portion 5N, and the two third power terminal portions 5O may or may not be plated.

Figure 11:
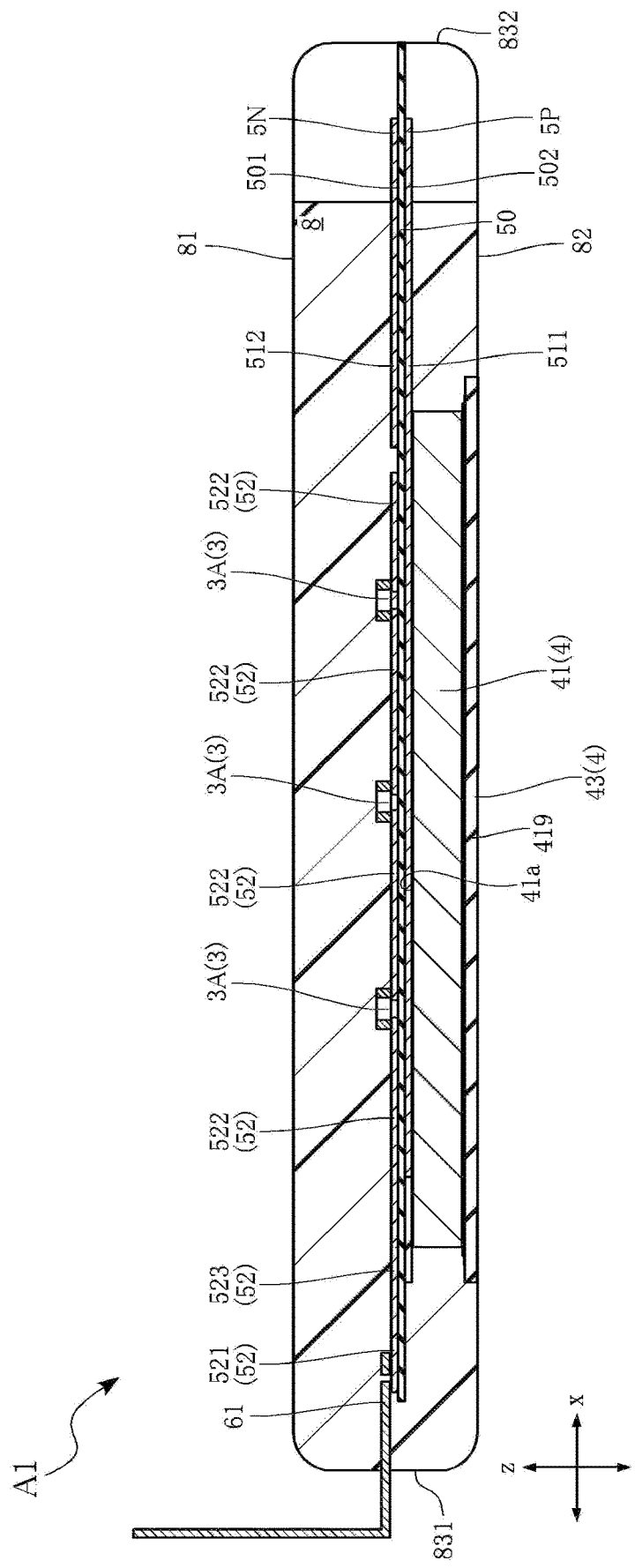
FIG. 11 is a cross-sectional view taken along line XI-XI in FIG. 4.

As can be seen from FIGS. 7, 9 and 11, the first power terminal portion 5P and the second power terminal portion 5N overlap with each other in plan view. As can be seen from FIGS. 7, 9 and 12, the two third power terminal portions 5O overlap with each other in plan view. Although the semiconductor device A1 in the illustrated example includes the two third power terminal portions 5O, the semiconductor device A1 may include only one of the two third power terminal portions 5O in a different example.

In the semiconductor device A1, the signal wiring sections 52 to 56 form conduction paths of a control signal. As shown in FIGS. 4 and 7, the signal wiring sections 52 to 56 are formed on the obverse surface 501 of the insulating substrate 50.

Figure 1:
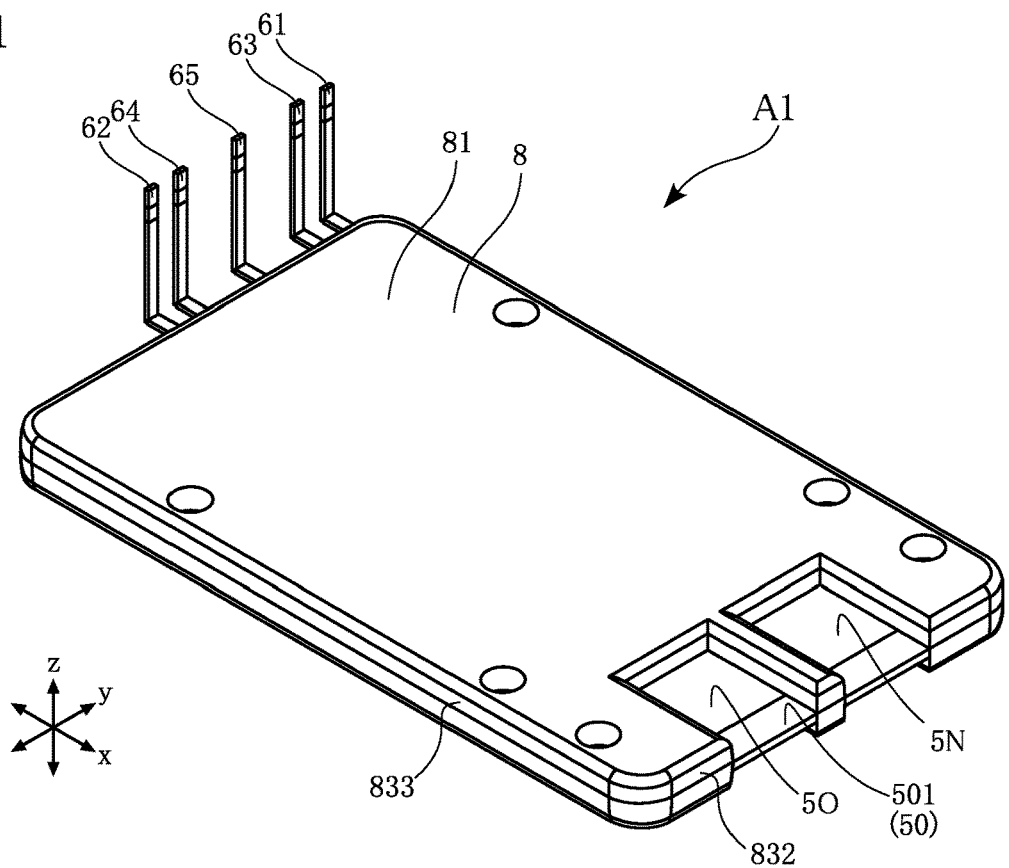
FIG. 1 is a perspective view showing a semiconductor device according to a first embodiment.
Figure 2:
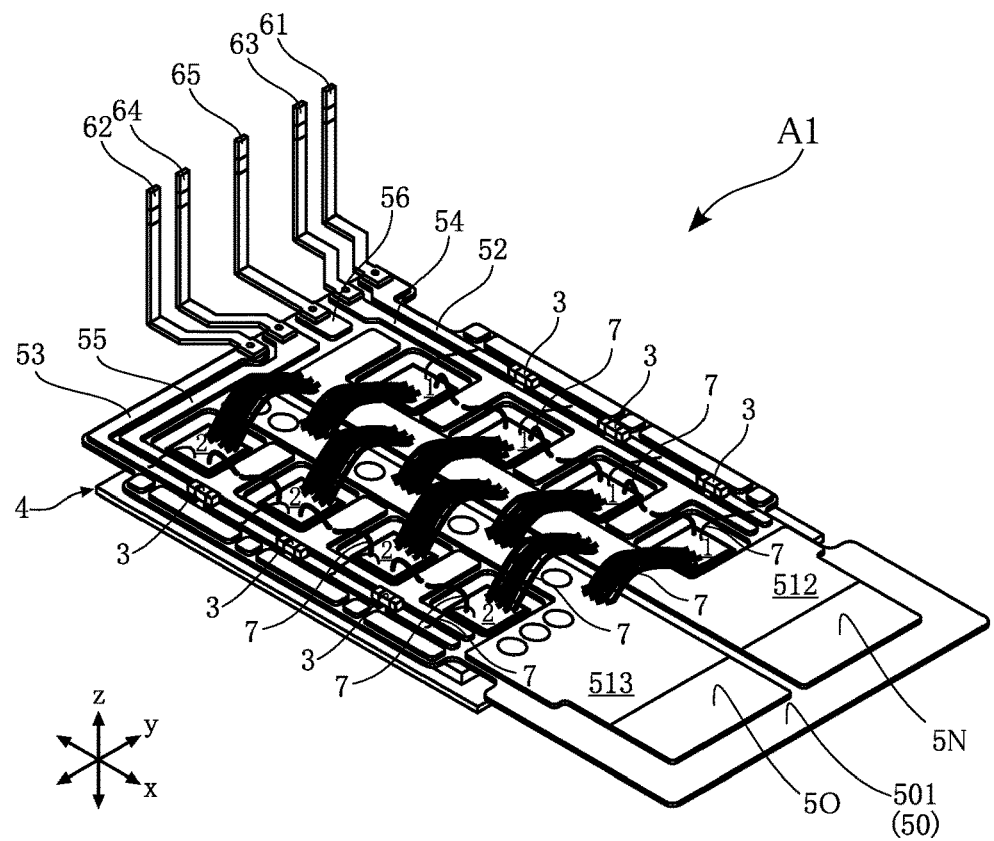
FIG. 2 is a perspective view similar to FIG. 1 but omitting a resin member.

As shown in FIGS. 2 and 4, the control terminal 61 is electrically bonded to the signal wiring section 52. The signal wiring section 52 is electrically connected to the third electrodes 13 of the first semiconductor elements 1. The signal wiring section 52 forms a transmission path for a first drive signal, together with the connecting members 731. The signal wiring section 52 is an example of a "first signal wiring section". As shown in FIGS. 4, 7, and 11, the signal wiring section 52 includes a bonding portion 521, a plurality of individual portions 522, and an extending portion 523.

As shown in FIGS. 4 and 11, the control terminal 61 is bonded to the bonding portion 521. As shown in FIGS. 4 and 7, the bonding portion 521 is located at the end of the insulating substrate 50 in a second sense (left side in FIG. 4) of the first direction x in plan view. The bonding portion 521 is electrically connected to the individual portions 522. The bonding portion 521 is an example of a "first bonding portion".

As shown in FIGS. 4, 7, and 11, the individual portions 522 are aligned in the first direction x and spaced apart from each other. As shown in FIGS. 4 and 7, each of the individual portions 522 has a strip shape extending in the first direction x in plan view. As shown in FIGS. 4, 7, and 11, each of the individual portions 522 has a connecting member 731 and a first circuit component 3A bonded thereto. Two individual portions 522 adjacent in the first direction x are electrically connected to each other via a first circuit component 3A. As shown in FIGS. 4 and 7, the individual portions 522 are located opposite (upward in FIG. 4) from the second semiconductor elements 2 with respect to the first semiconductor elements 1 in the second direction y. The individual portions 522 are located in the first sense (right side in FIG. 4) of the first direction x from the bonding portion 521. Each of the individual portions 522 is an example of a "first individual portion".

The extending portion 523 extends from the bonding portion 521 to one of the individual portions 522. The extending portion 523 electrically connects the bonding portion 521 and one of the individual portions 522. In the examples shown in FIGS. 4 and 7, the extending portion 523 is connected to one of the individual portions 522 that is closest to the bonding portion 521 in the first direction x. In the example shown in FIG. 4, the individual portion 522 connected to the extending portion 523 is the outermost one of the individual portions 522 in the second sense (left side in FIG. 4) of the first direction x.

As shown in FIGS. 2 and 4, the control terminal 62 is electrically bonded to the signal wiring section 53. The signal wiring section 53 is electrically connected to the sixth electrodes 23 of the second semiconductor elements 2. The signal wiring section 53 forms a transmission path for a second drive signal, together with the connecting members 732.

Figure 12:
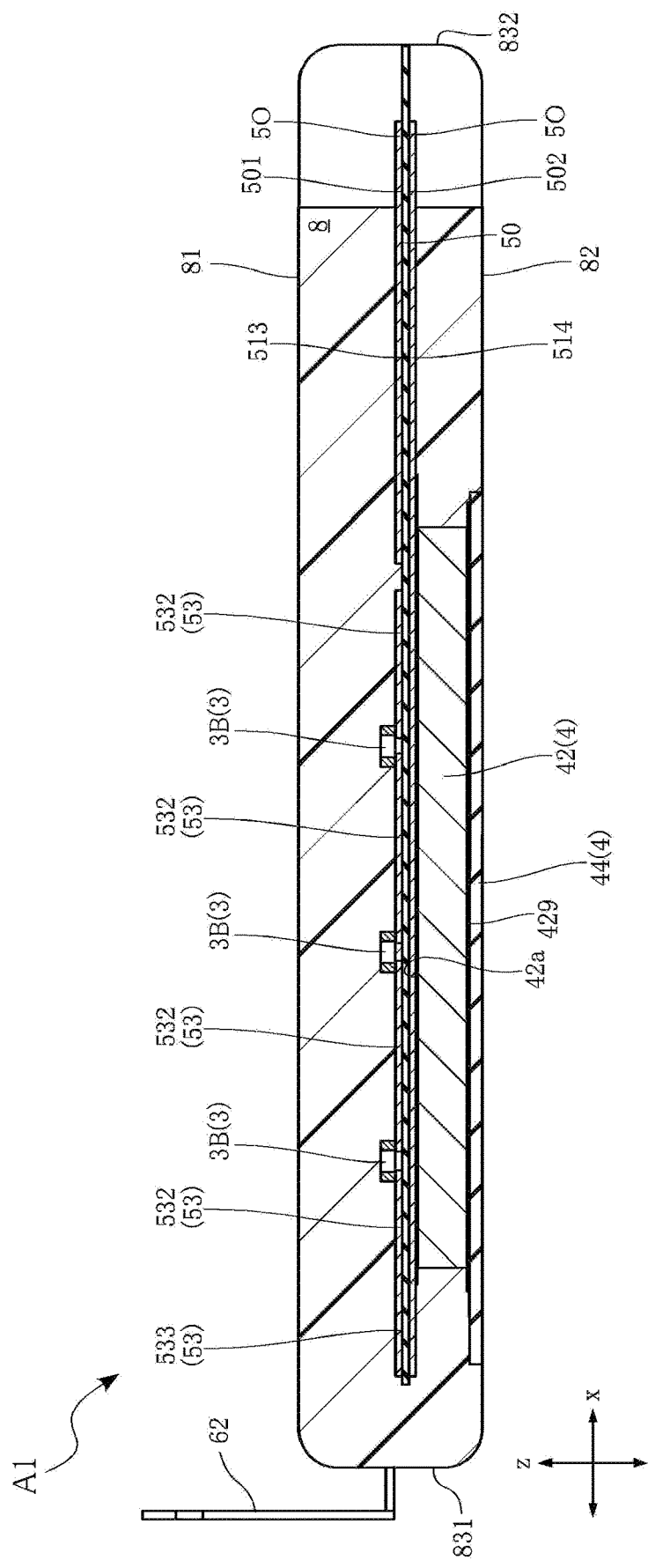
FIG. 12 is a cross-sectional view taken along line XII-XII in FIG. 4.

The second circuit components 3B are bonded to the signal wiring section 53. The signal wiring section 53 is an example of a "second signal wiring section". As shown in FIGS. 4, 7, and 12, the signal wiring section 53 includes a bonding portion 531, a plurality of individual portions 532, and an extending portion 533.

As shown in FIG. 4, the control terminal 62 is bonded to the bonding portion 531. As shown in FIGS. 4 and 7, the bonding portion 531 is located at the end of the insulating substrate 50 in the second sense (left side in FIG. 4) of the first direction x in plan view. The bonding portion 531 is electrically connected to the individual portions 532. The bonding portion 531 is an example of a "second bonding portion".

As shown in FIGS. 4, 7, and 12, the individual portions 532 are aligned in the first direction x and spaced apart from each other. As shown in FIGS. 4 and 7, each of the individual portions 532 has a strip shape extending in the first direction x in plan view. As shown in FIGS. 4, 7, and 12, each of the individual portions 532 has a connecting member 732 and a second circuit component 3B bonded thereto. Two individual portions 532 adjacent in the first direction x are electrically connected to each other via a second circuit component 3B. As shown in FIGS. 4 and 7, the individual portions 532 are located opposite (downward in FIG. 4) from the first semiconductor elements 1 with respect to the second semiconductor elements 2 in the second direction y. The individual portions 532 are located in the first sense (right side in FIG. 4) of the first direction x from the bonding portion 531. Each of the individual portions 532 is an example of a "second individual portion".

The extending portion 533 extends from the bonding portion 531 to one of the individual portions 532. The extending portion 533 electrically connects the bonding portion 531 and one of the individual portions 532. In the examples shown in FIGS. 4 and 7, the extending portion 533 is connected to one of the individual portions 532 that is closest to the bonding portion 531 in the first direction x. In the example shown in FIG. 4, the individual portion 532 connected to the extending portion 533 is the outermost one of the individual portions 532 in the second sense (left side in FIG. 4) of the first direction x. In the examples shown in FIGS. 4 and 7, the most part of the extending portion 533 has a strip shape extending in the second direction y in plan view.

As shown in FIGS. 2 and 4, the detection terminal 63 is electrically bonded to the signal wiring section 54. The signal wiring section 54 is electrically connected to the second electrodes 12 of the first semiconductor elements 1. The signal wiring section 54 forms a transmission path for a first detection signal, together with the connecting members 741. As shown in FIGS. 4 and 7, the signal wiring section 54 includes a bonding portion 541, a strip portion 542, a plurality of pad portions 543, and an extending portion 544. In the semiconductor device A1, the bonding portion 541, the strip portion 542, the pad portions 543, and the extending portion 544 are formed integrally.

As shown in FIG. 4, the detection terminal 63 is bonded to the bonding portion 541. The bonding portion 541 is located at the end of the insulating substrate 50 in the second sense (left side in FIG. 4) of the first direction x in plan view.

As shown in FIGS. 4 and 7, the strip portion 542 extends in the first direction x in plan view. The strip portion 542 is elongated in the first direction x. In the examples shown in FIGS. 4 and 7, the strip portion 542 is located in the first sense (upward in FIG. 4) of the second direction y from the first semiconductor elements 1 in plan view. In plan view, the strip portion 542 is flanked by the first semiconductor elements 1 and the individual portions 522 in the second direction y. The strip portion 542 is located in the first sense (right side in FIG. 4) of the first direction x from the bonding portion 541.

As shown in FIGS. 4, 5, and 7, each of the pad portions 543 is formed between two first semiconductor elements 1 that are adjacent to each other in the first direction x in plan view. In the example shown in FIG. 4, the pad portions 543 are arranged one each between one of the pair of first outer elements 1A and the first inner element 1B adjacent thereto, between the other one of the pair of first outer elements 1A and the first inner element 1B adjacent thereto, and between the two first inner elements 1B. As shown in FIGS. 4 and 5, two connecting members 741 are bonded to each of the pad portions 543. The pad portions 543 are connected to the strip portion 542, and in the present embodiment, are connected to the edge of the strip portion 542 on the side where the first semiconductor elements 1 are arranged in the second direction y. The pad portions 543 overlap with the strip portion 542 as viewed in the second direction y. Unlike the illustrated example, the pad portions 543 may be separated from the strip portion 542. In this case, the pad portions 543 may be electrically connected to the strip portion 542 via bonding wires, for example.

As shown in FIGS. 4 and 7, the extending portion 544 extends from the bonding portion 541 to the strip portion 542. The extending portion 544 electrically connects the bonding portion 541 and the strip portion 542.

As shown in FIGS. 2 and 4, the detection terminal 64 is electrically bonded to the signal wiring section 55. The signal wiring section 55 is electrically connected to the second electrodes 12 of the second semiconductor elements 2. The signal wiring section 55 forms a transmission path for a second detection signal, together with the connecting members 742. As shown in FIGS. 4 and 7, the signal wiring section 55 includes a bonding portion 551, a strip portion 552, a plurality of pad portions 553, and an extending portion 554. In the semiconductor device A1, the bonding portion 551, the strip portion 552, the pad portions 553, and the extending portion 554 are formed integrally.

As shown in FIG. 4, the detection terminal 64 is bonded to the bonding portion 551. The bonding portion 551 is located at the end of the insulating substrate 50 in the second sense (left side in FIG. 4) of the first direction x in plan view.

As shown in FIGS. 4 and 7, the strip portion 552 extends in the first direction x in plan view. The strip portion 552 is elongated in the first direction x. In the examples shown in FIGS. 4 and 7, the strip portion 552 is located in the second sense (downward in FIG. 4) of the second direction y from the second semiconductor elements 2 in plan view. In plan view, the strip portion 552 is flanked by the second semiconductor elements 2 and the individual portions 532 in the second direction y. The strip portion 552 is located in the first sense (right side in FIG. 4) of the first direction x from the bonding portion 551. The strip portion 552 is parallel (or substantially parallel) to the strip portion 542 in plan view.

As shown in FIGS. 4, 6, and 7, each of the pad portions 553 is formed between two second semiconductor elements 2 that are adjacent to each other in the first direction x in plan view. In the examples shown in FIGS. 4 and 7, the pad portions 553 are arranged one each between one of the pair of second outer elements 2A and the second inner element 2B adjacent thereto, between the other one of the pair of second outer elements 2A and the second inner element 2B adjacent thereto, and between the two second inner elements 2B. As shown in FIGS. 4 and 6, two connecting members 742 are bonded to each of the pad portions 553. The pad portions 553 are connected to the strip portion 552, and in the present embodiment, are connected to the edge of the strip portion 552 on the side where the second semiconductor elements 2 are arranged in the second direction y. The pad portions 553 overlap with the strip portion 552 as viewed in the second direction y. Unlike the illustrated example, the pad portions 553 may be separated from the strip portion 552. In this case, the pad portions 553 may be electrically connected to the strip portion 552 via bonding wires, for example.

As shown in FIGS. 4 and 7, the extending portion 554 extends from the bonding portion 551 to the strip portion 552. The extending portion 554 electrically connects the bonding portion 551 and the strip portion 552. In the examples shown in FIGS. 4 and 7, the most part of the extending portion 554 has a strip shape extending in the second direction y.

As shown in FIG. 2, the detection terminal 65 is electrically bonded to the signal wiring section 56. The signal wiring section 56 is electrically connected to the first electrodes 11 of the first semiconductor elements 1. As shown in FIG. 7, the signal wiring section 56 is formed with a through-hole 561. The through-hole 561 penetrates through the signal wiring section 56 in the thickness direction z. As shown in FIG. 7, the metal member 58 is fitted in the through-hole 561.

As shown in FIG. 11, the metal members 59 penetrate through the insulating substrate 50 in the thickness direction z to electrically connect the power wiring section 513 and the power wiring section 514. Each of the metal members 59 is columnar, for example. In the illustrated example, each of the metal members 59 has a circular shape in plan view (see FIGS. 5 to 8). In a different example, each of the metal members 59 may have an elliptical shape or a polygonal shape in plan view, instead of a circular shape. The metal members 59 may be made of copper or a copper alloy, for example.

As shown in FIGS. 6 to 8, and 11, each of the metal members 59 is fitted in a through-hole 513a of the power wiring section 513 and a through-hole 514b of the power wiring section 514, and is inserted in a through-hole 503 of the insulating substrate 50. The metal member 59 is in contact with the inner surface of the through-hole 513a and the inner surface of the through-hole 514b. The metal member 59 is supported by the through-hole 513a and the through-hole 514b by being fitted therein. When there is a clearance between the metal member 59 and the inner surface of the through-hole 513a and between the metal member 59 and the inner surface of the through-hole 514b, solder may be injected into the clearance. As such, the clearance is filled with the solder, and the metal member 59 is bonded to the power wiring section 513 and the power wiring section 514. Note that the injected solder may also flow into the clearance between the metal member 59 and the inner surface of the through-hole 503 in the insulating substrate 50.

The metal member 58 penetrates through the insulating substrate 50 in the thickness direction z to electrically connect the power wiring section 511 and the signal wiring section 56. The metal member 58 is columnar, for example. In the illustrated example, the metal member 58 has a circular shape in plan view (see FIGS. 6 to 8). In a different example, the metal member 58 may have an elliptical shape or a polygonal shape in plan view, instead of a circular shape. The metal member 58 may be made of copper or a copper alloy, for example.

As shown in FIGS. 7 to 9, the metal member 58 is fitted in the through-hole 561 of the signal wiring section 56 and the through-hole 511b of the power wiring section 511, and is inserted in the through-hole 504 of the insulating substrate 50. As shown in FIGS. 7 to 9, the metal member 58 is in contact with the inner surface of the through-hole 561, the inner surface of the through-hole 511b, and the inner surface of the through-hole 504. When there is a clearance between the metal member 58 and the inner surfaces of the through-holes 561, 511b, and 504, solder may be injected into the clearance. As such, the clearance is filled with the solder, and the metal member 58 is bonded to the power wiring section 511, the signal wiring section 56, and the insulating substrate 50.

As shown in FIGS. 14 and 15, each of the first semiconductor elements 1 of the semiconductor device A1 is accommodated in a recess defined by an opening 505 in the insulating substrate 50, an opening 511a in the power wiring section 511, and the conductive plate 41. In the illustrated example, the element obverse surface 10a of the first semiconductor element 1 overlaps with either the insulating substrate 50 or the power wiring section 511 as viewed in a direction perpendicular to the thickness direction z (e.g., in the second direction y). In another example, the element obverse surface 10a may overlap with the power wiring section 512. In either example, the first semiconductor element 1 does not protrude upward in the thickness direction z beyond the power wiring section 512. Similarly, as shown in FIGS. 14 and 16, each of the second semiconductor elements 2 is accommodated in a recess defined by an opening 506 in the insulating substrate 50, an opening 514a in the power wiring section 514, and the conductive plate 42. In the illustrated example, the element obverse surface 20a of the second semiconductor element 2 overlaps with either the insulating substrate 50 or the power wiring section 514 as viewed in a direction perpendicular to the thickness direction z (e.g., in the second direction y). In another example, the element obverse surface 20a may overlap with the power wiring section 513. In either example, the second semiconductor element 2 does not protrude upward in the thickness direction z beyond the power wiring section 513.

The control terminals 61 and 62 and the detection terminals 63 to 65 are each made of an electrically conductive material. Examples of the electrically conductive material include copper or a copper alloy. The control terminals 61 and 62 and the detection terminals 63 to 65 may be formed by cutting and bending a plate-like material. As shown in FIGS. 1 to 4, and 10, the control terminals 61 and 62 and the detection terminals 63 to 65 are located in the second sense (left side in FIG. 4) of the first direction x from the first semiconductor elements 1 and the second semiconductor elements 2, and are opposite from the first power terminal portion 5P, the second power terminal portion 5N, and the two third power terminal portions 5O with respect to the first semiconductor elements 1 and the second semiconductor elements 2.

The control terminal 61 is electrically connected to the third electrodes 13 (gate electrodes) of the first semiconductor elements 1. The control terminal 61 is used to input a first drive signal for controlling the switching operations of the first semiconductor elements 1. As shown in FIGS. 1 to 4, 10, and 11, the control terminal 61 includes a portion covered with the resin member 8 and a portion exposed from the resin member 8. The covered portion of the control terminal 61 is bonded to the bonding portion 521 of the signal wiring section 52. The exposed portion of the control terminal 61 is connected to an external control device (e.g., a gate driver), and is used to input a first drive signal (gate voltage) from the external control device. The control terminal 61 is an example of a "first control terminal".

The control terminal 62 is electrically connected to the sixth electrodes 23 (gate electrodes) of the second semiconductor elements 2. The control terminal 62 is used to input a second drive signal for controlling the switching operations of the second semiconductor elements 2. As shown in FIGS. 1 to 4, and 10, the control terminal 62 includes a portion covered with the resin member 8 and a portion exposed from the resin member 8. The covered portion of the control terminal 62 is bonded to the bonding portion 531 of the signal wiring section 53. The control terminal 62 is an example of a "second control terminal".

The detection terminal 63 is electrically connected to the second electrodes 12 (source electrodes) of the first semiconductor elements 1. The detection terminal 63 outputs a first detection signal indicating the conducting state of each first semiconductor element 1. In the semiconductor device A1, the detection terminal 63 outputs, as the first detection signal, the voltage applied to the second electrode 12 of each first semiconductor element 1 (voltage corresponding to the source current). As shown in FIGS. 1 to 4, and 10, the detection terminal 63 includes a portion covered with the resin member 8 and a portion exposed from the resin member 8. The covered portion of the detection terminal 63 is bonded to the bonding portion 541 of the signal wiring section 54. The exposed portion of the detection terminal 63 is connected to the external control device mentioned above and outputs the first detection signal to the external control device.

The detection terminal 64 is electrically connected to the fifth electrodes 22 (source electrodes) of the second semiconductor elements 2. The detection terminal 64 outputs a second detection signal indicating the conducting state of each second semiconductor element 2. In the semiconductor device A1, the detection terminal 64 outputs, as the second detection signal, the voltage applied to the fifth electrode 22 of each second semiconductor element 2 (voltage corresponding to the source current). As shown in FIGS. 1 to 4, and 10, the detection terminal 64 includes a portion covered with the resin member 8 and a portion exposed from the resin member 8. The covered portion of the detection terminal 64 is bonded to the bonding portion 551 of the signal wiring section 55. The exposed portion of the detection terminal 64 is connected to the external control device mentioned above and outputs the second detection signal to the external control device.

The detection terminal 65 is electrically connected to the first electrodes 11 (the drain electrodes) of the first semiconductor elements 1. The detection terminal 65 outputs the voltage applied to the first electrode 11 of each first semiconductor element 1 (voltage corresponding to the drain current). As shown in FIGS. 1 to 4, and 10, the detection terminal 65 includes a portion covered with the resin member 8 and a portion exposed from the resin member 8. The covered portion of the detection terminal 65 is bonded to the signal wiring section 56. The exposed portion of the detection terminal 65 is connected to the external control device mentioned above and outputs the voltage applied to the first electrode 11 of each first semiconductor element 1 (voltage corresponding to the drain current) to the external control device.

The connecting members 7 are used to electrically connect two separated parts. As described above, the connecting members 7 include the connecting members 71, 72, 731, 732, 741, and 742. Each of the connecting members 7 may be a bonding wire, for example. One or more of the connecting members 7 (e.g., the connecting members 71 and 72) may be metal plates instead of bonding wires. Each of the connecting members 7 may be made of gold, aluminum or copper.

As shown in FIGS. 4 and 5, each of the connecting members 71 is bonded to the first power pad 121 of the second electrode 12 (source electrode) of a first semiconductor element 1 and the power wiring section 513 to provide electrical connection between them. The principal current in the semiconductor device A1 flows through the connecting members 71. Unlike the illustrated example, one or more of the connecting members 71 may be bonded to the upper surface of a metal member 59 rather than to the power wiring section 513.

As shown in FIGS. 4 and 6, each of the connecting members 72 is bonded to the second power pad 221 of the fifth electrode 22 (source electrode) of a second semiconductor element 2 and the power wiring section 512 to provide electrical connection between them. The principal current in the semiconductor device A1 flows through the connecting members 72.

As shown in FIGS. 4 and 5, each of the connecting members 731 is bonded to the third electrode 13 (gate electrode) of a first semiconductor element 1 and an individual portion 522 of the signal wiring section 52 to provide electrical connection between them. The connecting members 731 transmit a first drive signal, together with the signal wiring section 52. Each of the connecting members 731 is a portion of the first conductive member. In two of the first semiconductor elements 1, the first conductive member is constituted by the connecting member 731 connected to one of the two first semiconductor elements 1, the connecting member 731 connected to the other one of the first semiconductor elements 1, and a portion of the signal wiring section 52 which is located between the points in the signal wiring section 52 to which these connecting members 731 are respectively connected. Each of the connecting members 731 is an example of a "first connecting member".

As shown in FIGS. 4 and 6, each of the connecting members 732 is bonded to the sixth electrode 23 (gate electrode) of a second semiconductor element 2 and an individual portion 532 of the signal wiring section 53 to provide electrical connection between them. The connecting members 732 transmit a second drive signal, together with the signal wiring section 53. Each of the connecting members 732 is a portion of the second conductive member. In two of the second semiconductor elements 2, the second conductive member is constituted by the connecting member 732 connected to one of the two second semiconductor elements 2, the connecting member 732 connected to the other one of the second semiconductor elements 2, and a portion of the signal wiring section 53 which is located between the points in the signal wiring section 53 to which these connecting members 732 are respectively connected. Each of the connecting members 732 is an example of a "second connecting member".

As shown in FIGS. 4 and 5, in the semiconductor device A1, the direction in which the connecting members 731 extend in plan view has a greater inclination relative to the alignment direction (first direction x) of the first semiconductor elements 1 than relative to the direction (second direction y) perpendicular to the alignment direction and the thickness direction z. Furthermore, as shown in FIGS. 4 and 6, the direction in which the connecting members 732 extend in plan view has a greater inclination relative to the alignment direction (first direction x) of the second semiconductor elements 2 than relative to the direction (second direction y) perpendicular to the alignment direction and the thickness direction z.

As shown in FIGS. 4 and 5, each of the connecting members 741 is bonded to a pad portion 543 (signal wiring section 54) and a first semiconductor element 1 adjacent to the pad portion 543 in plan view to provide electrical connection between them. As shown in FIG. 5, each of the connecting members 741 is bonded to a first detection pad 122 of the second electrode 12 (source electrode) of a first semiconductor element 1. As shown in FIGS. 4 and 5, the connecting member 741 bonded to one of the first detection pads 122 of a first semiconductor element 1, which is a first detection pad 122 offset in the first sense of the first direction x, is bonded to the pad portion 543 adjacent to the first semiconductor element 1 in the first sense of the first direction x in plan view. The connecting member 741 bonded to one of the first detection pads 122 of a first semiconductor element 1, which is a first detection pad 122 offset in the second sense of the first direction x, is bonded to the pad portion 543 adjacent to the first semiconductor element 1 in the second sense of the first direction x in plan view. As shown in FIGS. 4 and 5, in each of the pair of first outer elements 1A, a connecting member 741 is bonded to one of the two first detection pads 122, whereas in each of the first inner elements 1B, a connecting member 741 is bonded to each of the two first detection pads 122. The connecting members 741 transmit a first detection signal. In an example where the second electrode 12 of each first semiconductor element 1 is formed by a single pad, a connecting member 741 is bonded to the pad, together with connecting members 71.

As shown in FIGS. 4 and 6, each of the connecting members 742 is bonded to a pad portion 553 (signal wiring section 55) and a second semiconductor element 2 adjacent to the pad portion 553 in plan view to provide electrical connection between them. As shown in FIG. 6, each of the connecting members 742 is bonded to a second detection pad 222 of the fifth electrode 22 (source electrode) of a second semiconductor element 2. As shown in FIGS. 4 and 6, the connecting member 742 bonded to one of the second detection pads 222 of a second semiconductor element 2, which is a second detection pad 222 offset in the first sense of the first direction x, is bonded to the pad portion 553 adjacent to the second semiconductor element 2 in the first sense of the first direction x in plan view. The connecting member 742 bonded to one of the second detection pads 222 of a second semiconductor element 2, which is a second detection pad 222 offset in the second sense of the first direction x, is bonded to the pad portion 553 adjacent to the second semiconductor element 2 in the second sense of the first direction x in plan view. As shown in FIGS. 4 and 6, in each of the pair of second outer elements 2A, a connecting member 742 is bonded to one of the two second detection pads 222, whereas in each of the second inner elements 2B, a connecting member 742 is bonded to each of the two second detection pads 222. In an example where the fifth electrode 22 of each second semiconductor element 2 is formed by a single pad, a connecting member 742 is bonded to the pad, together with connecting members 72.

As shown in FIGS. 4 and 5, in the semiconductor device A1, the direction in which the connecting members 741 extend in plan view has a smaller inclination relative to the alignment direction (first direction x) of the first semiconductor elements 1 than relative to the direction (second direction y) perpendicular to the alignment direction and the thickness direction z. Furthermore, as shown in FIGS. 4 and 6, the direction in which the connecting members 742 extend in plan view has a smaller inclination relative to the alignment direction (first direction x) of the second semiconductor elements 2 than relative to the direction (second direction y) perpendicular to the alignment direction and the thickness direction z.

Although the diameters of the connecting members 71, 72, 731, 732, 741, and 742 are not specifically limited, the diameters of these connecting members have the following relationship in the semiconductor device A1. The diameter of each of the connecting members 71 and 72 is larger than the diameter of each of the connecting members 731, 732, 741, and 742. This is because the principal current flows through the connecting members 71 and 72. The diameter of each of the connecting members 741 and 742 is larger than the diameter of each of the connecting members 731 and 732.

Figure 10:
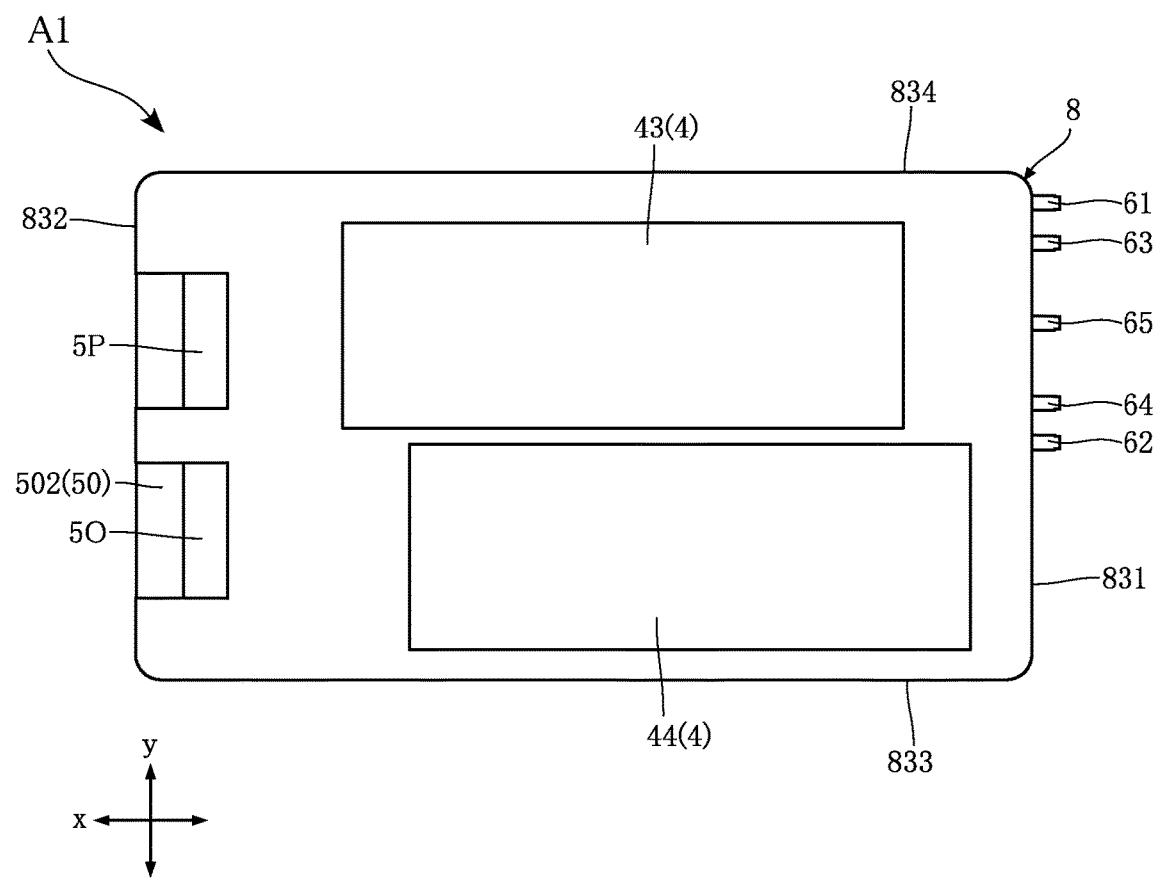
FIG. 10 is a bottom view showing the semiconductor device according to the first embodiment.

The resin member 8 is a sealer that protects the first semiconductor elements 1, the second semiconductor elements 2, the circuit components 3, and so on. The resin member 8 is made of an insulating resin material. The resin material is a black epoxy resin, for example. In the semiconductor device A1, the resin member 8 covers the first semiconductor elements 1, the second semiconductor elements 2, the circuit components 3, a portion of the supporting member 4, the insulating substrate 50, a portion of each of the power wiring sections 511 to 514, the signal wiring sections 52 to 56, a portion of each of the control terminals 61 and 62, a portion of each of the detection terminals 63 to 65, and the connecting members 7. As shown in FIGS. 3 and 10, the resin member 8 has a rectangular shape in plan view.

As shown in FIGS. 1, 3, 4, and 10 to 14, the resin member 8 has a resin obverse surface 81, a resin reverse surface 82, and a plurality of resin side surfaces 831 to 834. As shown in FIGS. 10 to 14, the resin obverse surface 81 and the resin reverse surface 82 are spaced apart from each other in the thickness direction z. The resin obverse surface 81 faces in the first sense (upward) of the thickness direction z, and the resin reverse surface 82 faces in the second sense (downward) of the thickness direction z. As shown in FIGS. 10 to 14, the resin side surfaces 831 to 834 are sandwiched between the resin obverse surface 81 and the resin reverse surface 82 in the thickness direction z, and are connected to the resin obverse surface 81 and the resin reverse surface 82. As shown in FIGS. 3, 4, and 10 to 12, the resin side surface 831 and the resin side surface 832 are spaced apart from each other in the first direction x. The resin side surface 831 faces in the first sense of the first direction x, and the resin side surface 832 faces in the second sense of the first direction x. As shown in FIGS. 3, 4, and 10, the pair of control terminals 61 and 62 and the detection terminals 63 to 65 protrude from the resin side surface 831. As shown in FIGS. 3, 4, 10, 13, and 14, the resin side surface 833 and the resin side surface 834 are spaced apart from each other in the second direction y. The resin side surface 833 faces in the first sense of the second direction y, and the resin side surface 834 faces in the second sense of the second direction y.

As shown in FIGS. 3, 4, and 10 to 12, the resin member 8 has cut-away portions formed at the resin side surface 832 on each of the resin obverse surface 81 and the resin reverse surface 82. As shown in FIGS. 3, 4, and 10 to 12, the cut-away portions expose the first power terminal portion 5P, the second power terminal portion 5N, and the pair of third power terminal portions 5O from the resin member 8.

The semiconductor device A1 has the following advantages.

The semiconductor device A1 includes the first circuit components 3A that increase impedance in the first frequency band, and the third electrodes 13 of the first semiconductor elements 1 are electrically connected to each other via at least one of the first circuit components 3A. The first frequency band includes the resonance frequency of a resonance circuit that is formed by including the parasitic inductance of the first conductive member electrically interposed between the third electrodes 13 of the first semiconductor elements 1. In the semiconductor device A1, the first conductive member includes a portion of the signal wiring section 52 and the connecting members 731, for example. When the first semiconductor elements 1 are connected in parallel, a loop path is formed that passes through the first electrodes 11 (drain electrodes) and the third electrodes 13 (gate electrodes) of the first semiconductor elements 1. In the loop path, a resonance circuit including the parasitic inductance of the first conductive member is formed, and the impedance of the loop path is low with the resonance frequency of this resonance circuit. The resonance phenomenon that occurs when the first semiconductor elements 1 are operated in parallel tends to occur more easily when the impedance of the loop path is lower. As such, in the semiconductor device A1, the first circuit components 3A are connected to the first conductive member to electrically connect the third electrodes 13 of the first semiconductor elements 1 to each other via at least one of the first circuit components 3A. This makes it possible to increase the impedance in the first frequency band in the loop path. As a result, the semiconductor device A1 can suppress the resonance phenomenon that occurs when the first semiconductor elements 1 are operated in parallel. The same applies when the second semiconductor elements 2 are operated in parallel. That is, the semiconductor device A1 includes the second circuit components 3B that increase impedance in the second frequency band, and the sixth electrodes 23 of the second semiconductor elements 2 are electrically connected to each other via at least one of the second circuit components 3B. This allows the semiconductor device A1 to suppress the resonance phenomenon that occurs when the second semiconductor elements 2 are operated in parallel.

In the semiconductor device A1, the first circuit components 3A are inductance elements. Alternatively, the first circuit components 3A may be resistors instead of the inductance elements. Even in such an example, the impedance in the first frequency band can be increased. In other words, the semiconductor device A1 can use resistors as the first circuit components 3A to suppress the resonance phenomenon that occurs when the first semiconductor elements 1 are operated in parallel. However, using the resistors as the first circuit components 3A increases the impedance at a frequency outside the first frequency band as well, which leads to a concern for a decrease in the switching speed of each first semiconductor element 1 and an increase in the switching loss of each first semiconductor element 1. On the other hand, using the inductance elements as the first circuit components 3A can suppress an increase in the impedance at a frequency outside the first frequency band. This allows the semiconductor device A1 to suppress an increase in the impedance at the switching frequency of each first semiconductor element 1 to suppress, for example, a decrease in the switching speed of each first semiconductor element 1 and an increase in the switching loss of each first semiconductor element 1. This also applies to the second circuit components 3B. That is, the semiconductor device A1 uses the inductance elements rather than the resistors as the second circuit components 3B so as to suppress an increase in the impedance at a frequency outside the second frequency band. This allows the semiconductor device A1 to suppress an increase in the impedance at the switching frequency of each second semiconductor element 2 to suppress, for example, a decrease in the switching speed of each second semiconductor element 2 and an increase in the switching loss of each second semiconductor element 2.

In the semiconductor device A1, the first circuit components 3A are ferrite beads. Alternatively, the first circuit components 3A may be other inductance elements such as coils (wound inductance elements) instead of the ferrite beads. Even in this configuration, the impedance in the first frequency band can be increased. In other words, the semiconductor device A1 can use inductance elements other than ferrite beads as the first circuit components 3A to suppress the resonance phenomenon that occurs when the first semiconductor elements 1 are operated in parallel. However, while as for the general inductance elements (coils), a reactance component proactively functions regarding the impedance, as for the ferrite beads, a resistance component proactively functions in a high-frequency region regarding the impedance. The reactance component does not cause an energy loss, whereas the resistance component causes an energy loss. Thus, as compared to the general inductance elements, the ferrite beads have a higher performance in absorbing high-frequency vibrations and can remove the high-frequency vibrations more effectively. Furthermore, different types of ferrite beads can be used for the first circuit components 3A, so that the frequency characteristics and Q values of the respective first circuit components 3A can be easily adjusted according to variations in the performance of each first semiconductor element 1 and inequality in the current (drain current) of each first semiconductor element 1. Accordingly, for the purpose of suppressing a resonance phenomenon, it is preferable for the semiconductor device A1 to use ferrite beads as the first circuit components 3A rather than to use other inductance elements. This also applies to the second circuit components 3B. That is, for the purpose of suppressing a resonance phenomenon, it is preferable for the semiconductor device A1 to use ferrite beads as the second circuit components 3B rather than to use other inductance elements.

In the semiconductor device A1, the signal wiring section 52 includes the individual portions 522 that are spaced apart from each other. Each of the individual portions 522 is electrically connected to the third electrode 13 of a first semiconductor element 1 via a connecting member 731. Each of the first circuit components 3A is spanned between and bonded to two of the individual portions 522. According to this configuration, the third electrodes 13 of two or more first semiconductor elements 1 are electrically connected to one another via two connecting members 731, two or more individual portions 522, and one or more first circuit component 3A. Accordingly, the semiconductor device A1 can electrically connect the third electrodes 13 of the two or more first semiconductor elements 1 to one another via at least one of the two or more first circuit components 3A. The same applies to the circuit configuration of the lower arm. That is, the semiconductor device A1 can electrically connect the sixth electrodes 23 of the two or more second semiconductor elements 2 to one another via at least one of the two or more second circuit components 3B.

In the semiconductor device A1, the first power terminal portion 5P is arranged in the first sense of the direction (first direction x) in which the first semiconductor elements 1 are aligned. The resonance phenomenon that occurs when the first semiconductor elements 1 are operated in parallel is suppressed by equalizing the conduction paths from the first power terminal portion 5P to the first electrodes 11 (drain electrodes) of the first semiconductor elements 1. However, in the semiconductor device A1, equalization of the conduction paths is difficult due to the positional relationship between the first power terminal portion 5P and the first semiconductor elements 1. Thus, when equalization of the conduction paths from the first power terminal portion 5P to the respective third electrodes 13 is difficult, increase of the impedance between the third electrodes 13 (gate electrodes) using the first circuit components 3A as described above is effective in suppressing a resonance phenomenon. The same applies to the circuit configuration of the lower arm. That is, when equalization of the conduction paths from the third power terminal portions 5O to the fourth electrodes 21 (drain electrodes) of the second semiconductor elements 2 is difficult, using the second circuit components 3B to increase the impedance between the sixth electrodes 23 (gate electrodes) as described above is effective in suppressing a resonance phenomenon.

The semiconductor device A1 includes the connecting members 741, the detection terminal 63, and the signal wiring section 54. Each of the connecting members 741 is bonded to the second electrode 12 of a first semiconductor element 1. The detection terminal 63 is electrically connected to the second electrodes 12 of the first semiconductor elements 1. The signal wiring section 54 is electrically interposed between the detection terminal 63 and the connecting members 741. The research by the present inventor shows that when the first semiconductor elements 1 are operated in parallel in the semiconductor device A1, the occurrence frequency of a resonance phenomenon changes depending on the inductance of each conduction path between the second electrodes 12 (source electrodes) of the first semiconductor elements 1 via the connecting members 741 and the signal wiring section 54. Specifically, it has been found by the research that a resonance phenomenon is more likely to occur as the inductance increases, and that the occurrence of a resonance phenomenon can be suppressed by reducing the inductance. Accordingly, the signal wiring section 54 in the semiconductor device A1 has the pad portions 543 that are each located between two first semiconductor elements 1 adjacent to each other in the first direction x in plan view. Furthermore, each of the connecting members 741 is bonded to a pad portion 543 and the second electrode 12 of a first semiconductor element 1 adjacent to the pad portion 543 in plan view. This makes it possible to shorten the conduction paths between the second electrodes 12 of the first semiconductor elements 1 and reduce the inductance between the second electrodes 12 of the first semiconductor elements 1. For example, as compared to a configuration that is different from the configuration of the semiconductor device A1, and in which the connecting members 741 are bonded to the strip portion 542 instead of to the pad portions 543, the inductance between the second electrodes 12 can be reduced by shortening the conduction paths between the second electrodes 12. Accordingly, the semiconductor device A1 can suppress the resonance phenomenon that occurs when the first semiconductor elements 1 are operated in parallel. The same applies when the second semiconductor elements 2 are operated in parallel. In other words, the semiconductor device A1 can suppress the resonance phenomenon that occurs when the second semiconductor elements 2 are operated in parallel, since two fifth electrodes 22 that are adjacent to each other in the first direction x are electrically connected to each other via a pad portion 553 of the signal wiring section 55.

In the semiconductor device A1, the first semiconductor elements 1 include those (e.g., the first inner elements 1B) to which two connecting members 741 are connected. With this configuration, the conduction paths between the second electrodes 12 of the first semiconductor elements 1 can be shortened as compared to the case where only one connecting member 741 is connected to each of the first semiconductor elements 1. The same applies to the circuit configuration of the lower arm. In other words, since the second semiconductor elements 2 of the semiconductor device A1 include those (e.g., the second inner elements 2B) to which two connecting members 742 are connected, the conduction paths between the fifth electrodes 22 of the second semiconductor elements 2 can be shortened.

In the semiconductor device A1, the second electrode 12 of each first semiconductor element 1 includes two first detection pads 122. The two first detection pads 122 flank the third electrode 13 in the alignment direction (the first direction x) of the first semiconductor elements 1. With this configuration, it is possible to easily bond connecting members 741 to the first detection pads 122 of each of the first inner elements 1B of the first semiconductor elements 1, and to the pad portions 543 adjacent to the first inner element 1B in the alignment direction of the first semiconductor elements 1. As such, the semiconductor device A1 is preferable for shortening the conduction paths between the second electrodes 12 of the first semiconductor elements 1. The same applies to the circuit configuration of the lower arm. That is, in each of the second semiconductor elements 2, the two second detection pads 222 of the fifth electrode 22 flank the sixth electrode 23 in the alignment direction (the first direction x) of the second semiconductor elements 2. As such, the semiconductor device A1 is preferable for shortening the conduction paths between the fifth electrodes 22 of the second semiconductor elements 2.

In the semiconductor device A1, the diameter of each connecting member 741 is larger than the diameter of each connecting member 731. In this configuration, when the length of each connecting member 731 is the same as the length of each connecting member 741, the connecting member 741 has a parasitic inductance lower than that of the connecting member 731. Accordingly, the semiconductor device A1 is preferable for lowering the parasitic inductance between the second electrode 12 (the first detection pads 122) of each first semiconductor element 1 and a pad portion 543. Similarly, in the semiconductor device A1, the diameter of each connecting member 742 is larger than the diameter of each connecting member 732. In this configuration, when the length of each connecting member 732 is the same as the length of each connecting member 742, the connecting member 742 has a parasitic inductance lower than that of the connecting member 732. Accordingly, the semiconductor device A1 is preferable for lowering the parasitic inductance between the fifth electrode 22 (the second detection pads 222) of each second semiconductor element 2 and a pad portion 553.

Next, other embodiments of the semiconductor device of the present disclosure will be described.

Figure 18:
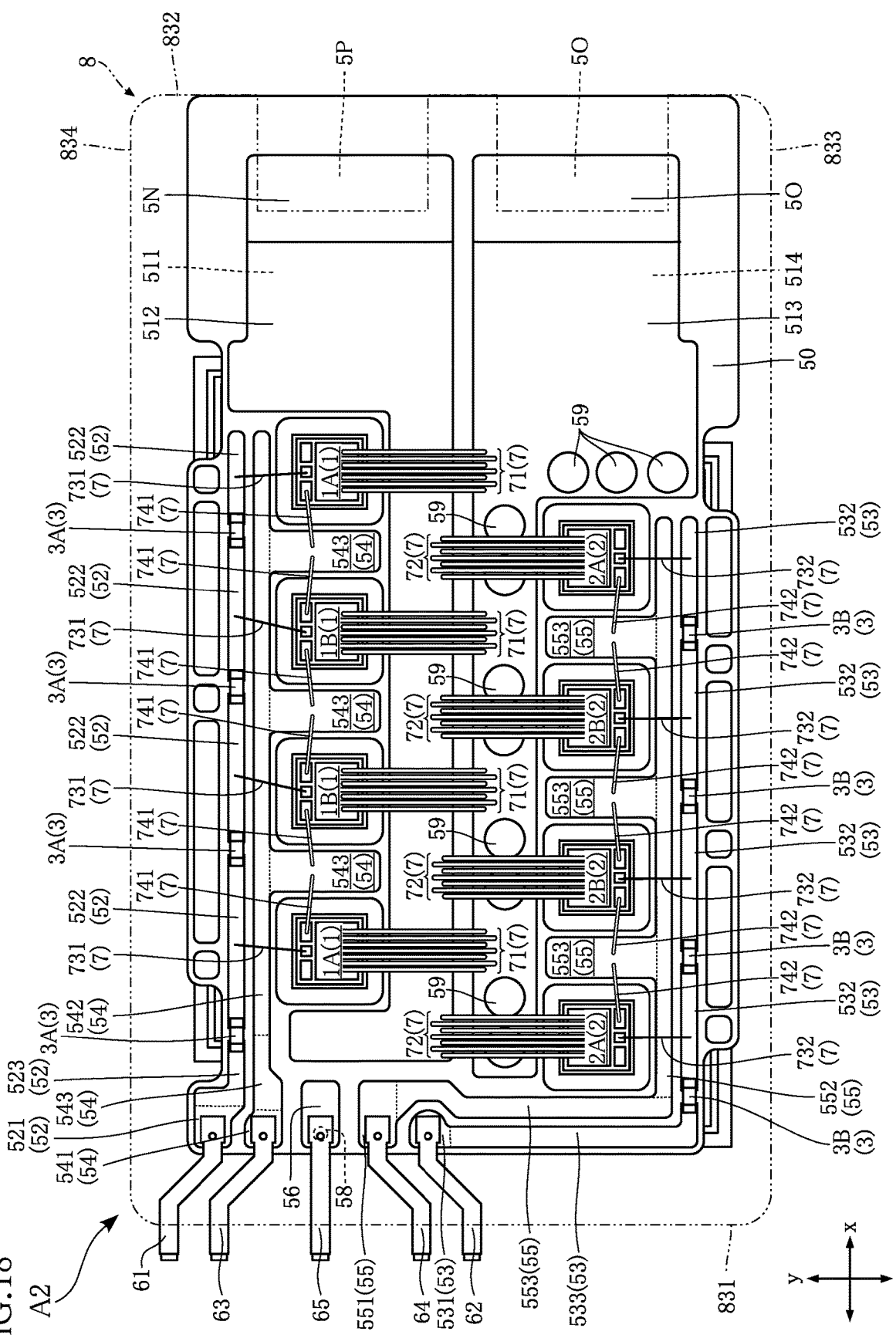
FIG. 18 is a plan view showing a semiconductor device according to a second embodiment with a resin member shown in phantom.
Figure 19:
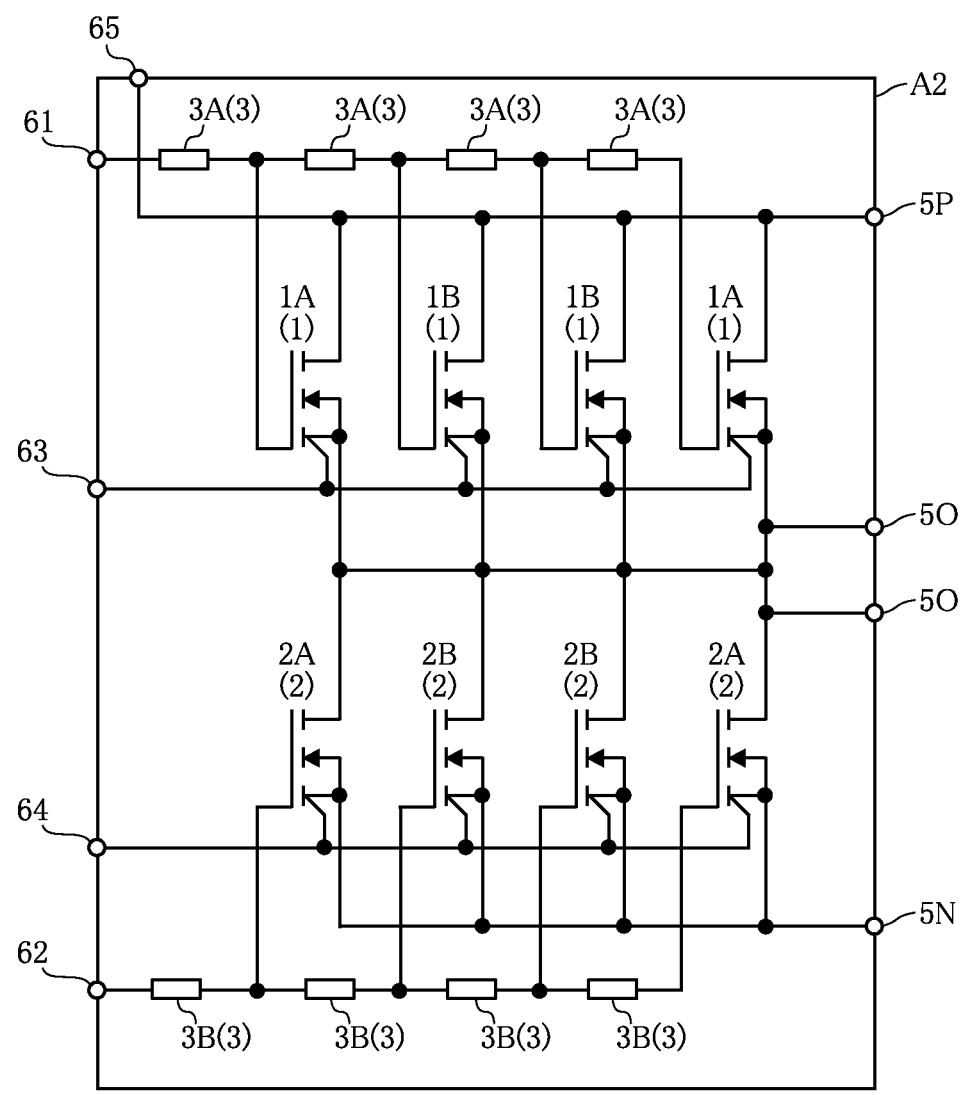
FIG. 19 shows an example of the circuit configuration of the semiconductor device according to the second embodiment.

FIGS. 18 and 19 show a semiconductor device A2 in a second embodiment.

The semiconductor device A2 is different from the semiconductor device A1 mainly in the following points. As shown in FIG. 18, the extending portion 523 of the semiconductor device A2 is not connected to any of the individual portions 522, and is spaced apart from the individual portions 522. However, the extending portion 523 and the individual portion 522 adjacent thereto are bonded to a first circuit component 3A, so that they are electrically connected to each other via the first circuit component 3A. Similarly, in the semiconductor device A2, the extending portion 533 is not connected to any of the individual portions 532, and is spaced apart from the individual portions 532. However, the extending portion 533 and the individual portion 532 adjacent thereto are bonded to a second circuit component 3B, so that they are electrically connected to each other via the second circuit component 3B.

As shown in FIG. 19, in the semiconductor device A2 configured as described above, at least one first circuit component 3A is electrically interposed in the conduction path from the control terminal 61 to the third electrode 13 (gate electrode) of each first semiconductor element 1. Similarly, at least one second circuit component 3B is electrically interposed in the conduction path from the control terminal 62 to the sixth electrode 23 (gate electrode) of each second semiconductor element 2.

Accordingly, the semiconductor device A2 can suppress the resonance phenomenon that occurs when the first semiconductor elements 1 are operated in parallel, similarly to the semiconductor device A1. Furthermore, the semiconductor device A2 can suppress the resonance phenomenon that occurs when the second semiconductor elements 2 are operated in parallel, similarly to the semiconductor device A1.

In the semiconductor device A2, at least one first circuit component 3A is interposed in the conduction path from the control terminal 61 to the third electrode 13 of each first semiconductor element 1. In a configuration that is different from the configuration of the semiconductor device A2, and that does not include the first circuit components 3A, if the conduction path from the control terminal 61 to each of the third electrodes 13 is short, the parasitic inductance in the conduction path becomes low. The low parasitic inductance is a factor that causes the occurrence of an unexpected parasitic oscillation in a first drive signal (e.g., gate voltage). However, in the semiconductor device A2, a first circuit component 3A is electrically interposed in the conduction path from the control terminal 61 to the third electrode 13 of each first semiconductor element 1, whereby the inductance of the conduction path can be increased. Accordingly, even the first semiconductor element 1 having the shortest conduction path from the control terminal 61 to the third electrode 13 can moderately ensure the inductance of the conduction path from the control terminal 61 to the third electrode 13. As such, the semiconductor device A2 can suppress the parasitic oscillation that occurs in each of the first semiconductor elements 1. The same applies to the circuit configuration of the lower arm. That is, according to the semiconductor device A2, at least two second circuit components 3B are interposed in the conduction path from the control terminal 62 to the sixth electrode 23 of each second semiconductor element 2. As such, the semiconductor device A2 can suppress the parasitic oscillation that occurs in each of the second semiconductor elements 2.

Although the second embodiment shows an example where the extending portion 523 is separated from the individual portions 522, the present disclosure is not limited to this example. For example, the extending portion 523 may be divided into two portions, and a common first circuit component 3A may be bonded to the two portions. Similarly, although the second embodiment shows an example where the extending portion 533 is separated from the individual portions 532, the present disclosure is not limited to this example. For example, the extending portion 533 may be divided into two portions, and a second circuit component 3B may be bonded to the two portions.

Figure 20:
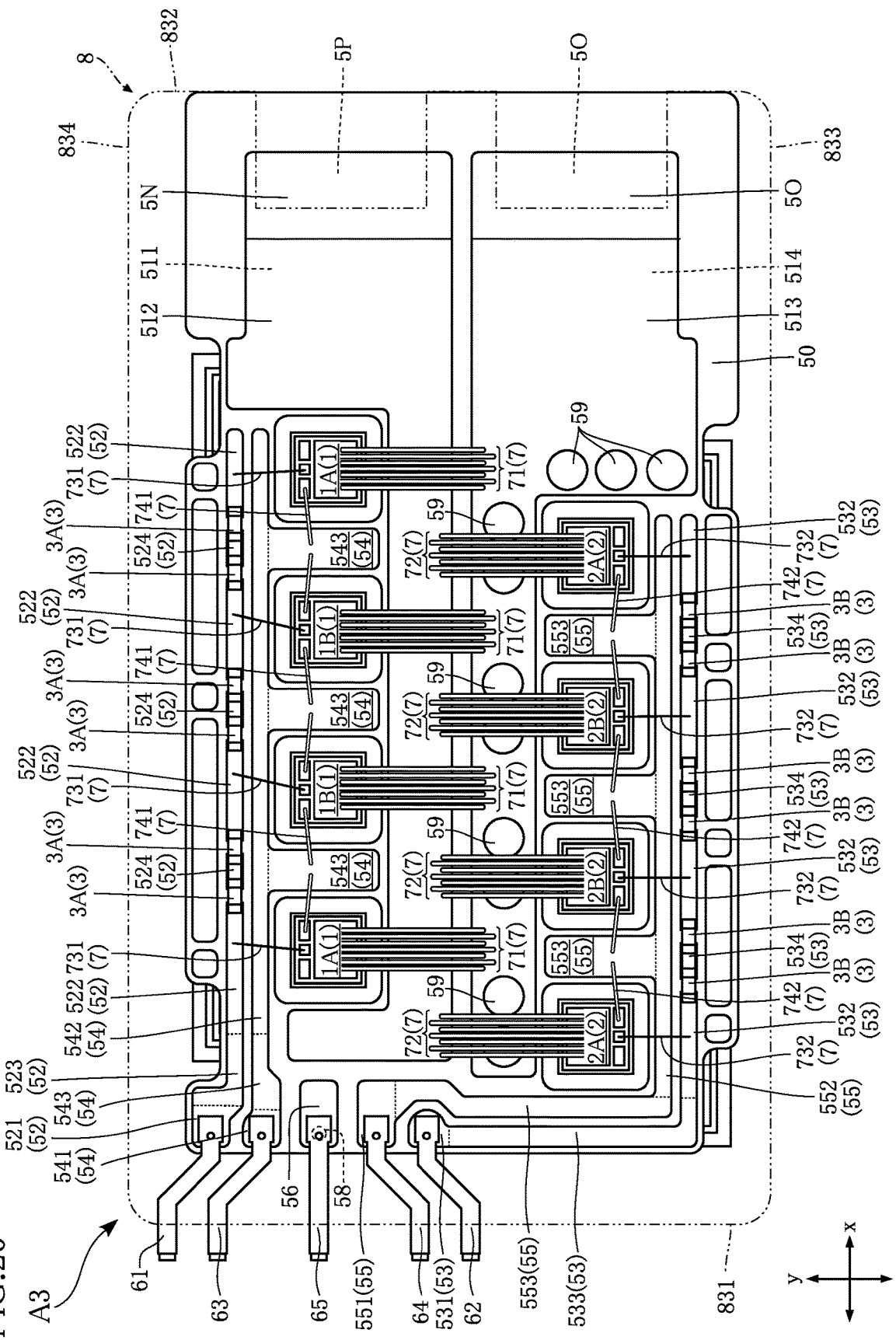
FIG. 20 is a plan view showing a semiconductor device according to a third embodiment with a resin member shown in phantom.
Figure 21:
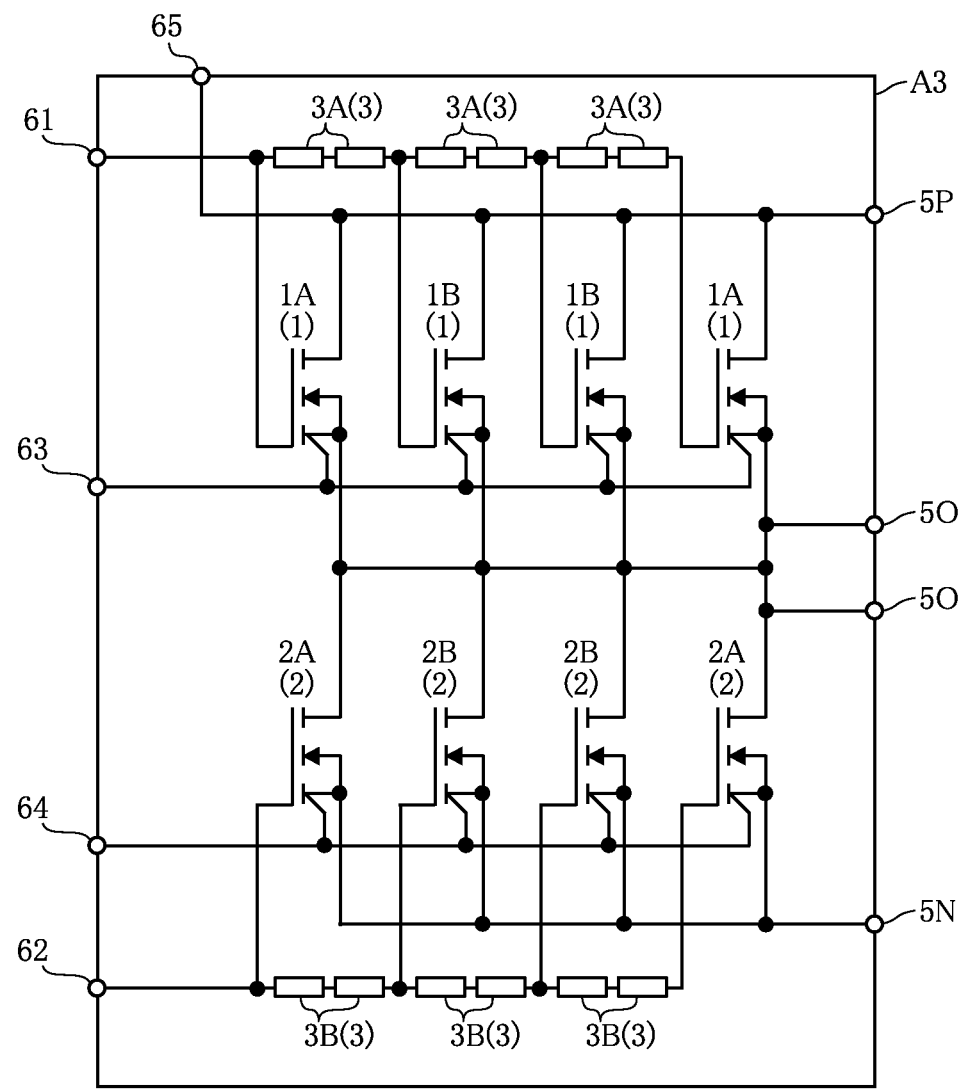
FIG. 21 shows an example of the circuit configuration of the semiconductor device according to the third embodiment.

FIGS. 20 and 21 show a semiconductor device A3 according to the third embodiment.

The semiconductor device A3 is different from the semiconductor device A1 mainly in the following points. As shown in FIG. 20, in the semiconductor device A3, two individual portions 522 that are adjacent to each other in the first direction x are electrically connected to each other via a plurality of first circuit components 3A connected in series. Along with this, the signal wiring section 52 of the semiconductor device A3 further includes a plurality of relay portions 524. In the illustrated example, two individual portions 522 that are adjacent to each other in the first direction x are electrically connected to each other via two first circuit components 3A. However, in another example, the two adjacent individual portions 522 may be electrically connected to each other via three or more first circuit components 3A. Similarly, in the semiconductor device A3, two individual portions 532 that are adjacent to each other in the first direction x are electrically connected to each other via a plurality of second circuit components 3B connected in series. Accordingly, the signal wiring section 53 of the semiconductor device A3 further includes a plurality of relay portions 534. In the illustrated example, two individual portions 532 that are adjacent to each other in the first direction x are electrically connected to each other via two second circuit components 3B. However, in another example, the two adjacent individual portions 532 may be electrically connected to each other via three or more second circuit components 3B.

As shown in FIG. 20, the relay portions 524 are provided one each between two adjacent individual portions 522 in the first direction x. A first circuit component 3A is bonded to a relay portion 524 and an individual portion 522 that are adjacent to each other in the first direction x. As a result, each of the relay portions 524 is electrically connected to an individual portion 522 located in the first sense of the first direction x via a first circuit component 3A, and is also electrically connected to an individual portion 522 located in the second sense of the first direction x via a first circuit component 3A. Thus, two individual portions 522 adjacent in the first direction x are electrically connected to each other via two first circuit components 3A and one relay portion 524. When three or more first circuit components 3A are arranged instead of two first circuit components 3A, the number of relay portions 524 to be arranged between adjacent individual portions 522 may be increased so that each pair of adjacent relay portions 524 is bonded to a first circuit component 3A.

Similarly, as shown in FIG. 20, the relay portions 534 are provided one each between two adjacent individual portions 532 in the first direction x. A second circuit component 3B is bonded to a relay portion 534 and an individual portion 532 that are adjacent to each other in the first direction x. As a result, each of the relay portions 534 is electrically connected to an individual portion 532 located in the first sense of the first direction x via a second circuit component 3B, and is also electrically connected to an individual portion 532 located in the second sense of the first direction x via a second circuit component 3B. Thus, two individual portions 532 adjacent in the first direction x are electrically connected to each other via two second circuit components 3B and one relay portion 534. When three or more second circuit components 3B are arranged instead of two second circuit components 3B, the number of relay portions 534 to be arranged between adjacent individual portions 532 may be increased so that each pair of adjacent relay portions 534 is bonded to a second circuit component 3B.

As shown in FIG. 21, in the semiconductor device A3 configured as described above, the third electrodes 13 (gate electrodes) of any two of the first semiconductor elements 1 are electrically connected to each other via at least two first circuit components 3A. Similarly, as shown in FIG. 21, the sixth electrodes 23 (gate electrodes) of any two of the semiconductor elements 2 are electrically connected to each other via at least two second circuit components 3B.

The first circuit components 3A connected in series between two adjacent individual portions 522 in the first direction x may have different target frequency bands or the same target frequency band for increasing impedance. In the case where the target frequency bands are different, the target frequency bands of the respective first circuit components 3A are combined, and thus the impedance can be increased with respect to a frequency band broader than the frequency band with respect to which the impedance can be increased for each individual first circuit component 3A. In this case, it suffices for the combined frequency band to include the first frequency band. On the other hand, in the case where the target frequency bands are the same, impedances of the respective first circuit components 3A can be combined to make the increase of the impedance even larger as for the target frequency band. This also applies to the second circuit components 3B connected in series between two adjacent individual portions 532 in the first direction x.

Accordingly, the semiconductor device A3 can suppress the resonance phenomenon that occurs when the first semiconductor elements 1 are operated in parallel, similarly to the semiconductor device A1. Furthermore, the semiconductor device A3 can suppress the resonance phenomenon that occurs when the second semiconductor elements 2 are operated in parallel, similarly to the semiconductor device A1.

In the semiconductor device A3, a plurality of first circuit components 3A connected in series are electrically interposed between two individual portions 522 that are adjacent to each other in the first direction x. According to this configuration, the individual performances (e.g., target frequency bands and impedances as described above) of the first circuit components 3A are appropriately combined, so that the impedance between two individual portions 522 is easily adjusted according to variations in the performance of each first semiconductor element 1 and inequality in the current (drain current) of each first semiconductor element 1. This also applies to the second circuit components 3B connected in series between two adjacent individual portions 532 in the first direction x.

In the third embodiment, the extending portion 523 and an individual portion 522 are directly connected to each other as in the semiconductor device A1. Alternatively, they may be connected to each other via a first circuit component 3A as in the semiconductor device A2. The same applies to the extending portion 533 and an individual portion 532.

Figure 22:
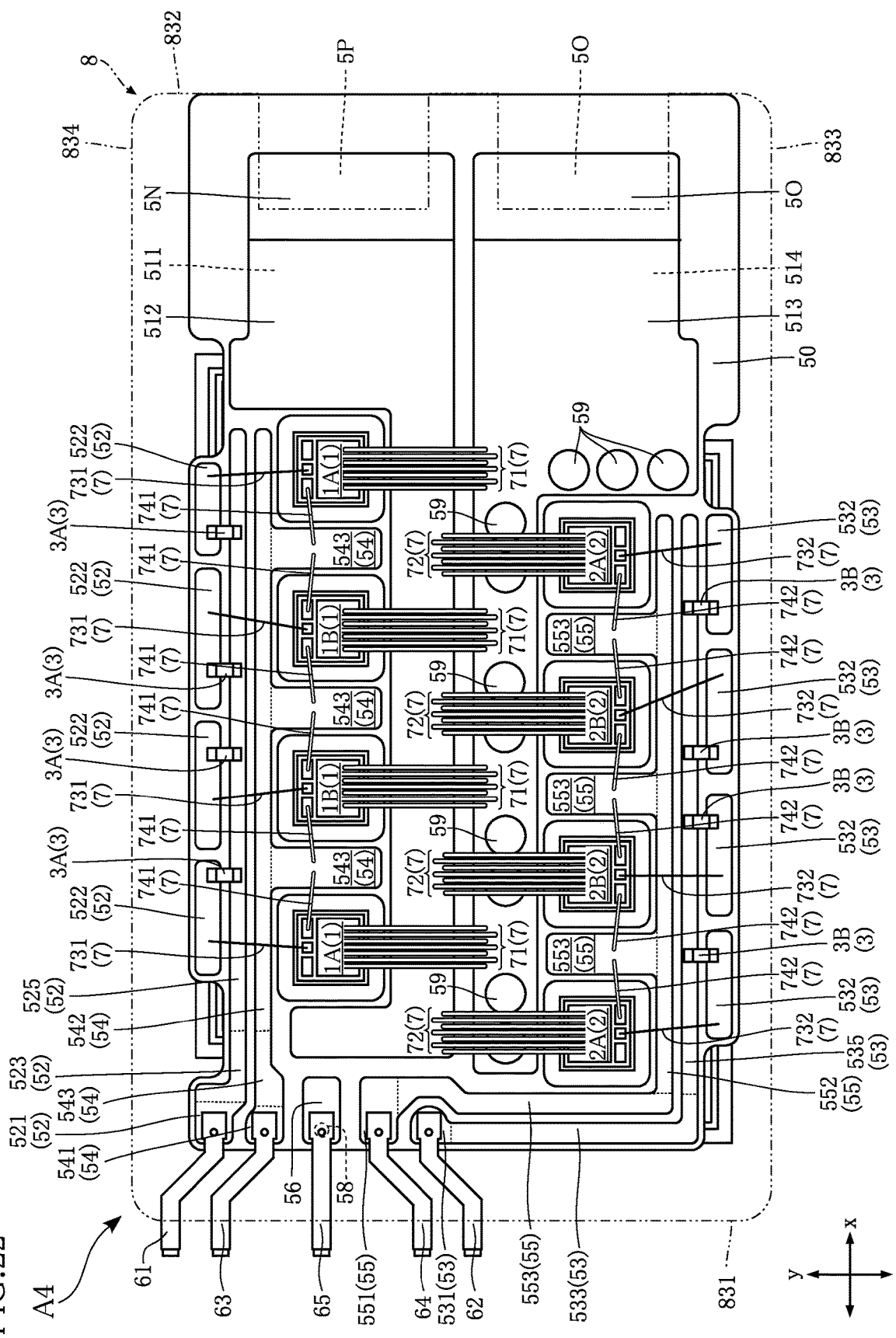
FIG. 22 is a plan view showing a semiconductor device according to a fourth embodiment with a resin member shown in phantom.
Figure 23:
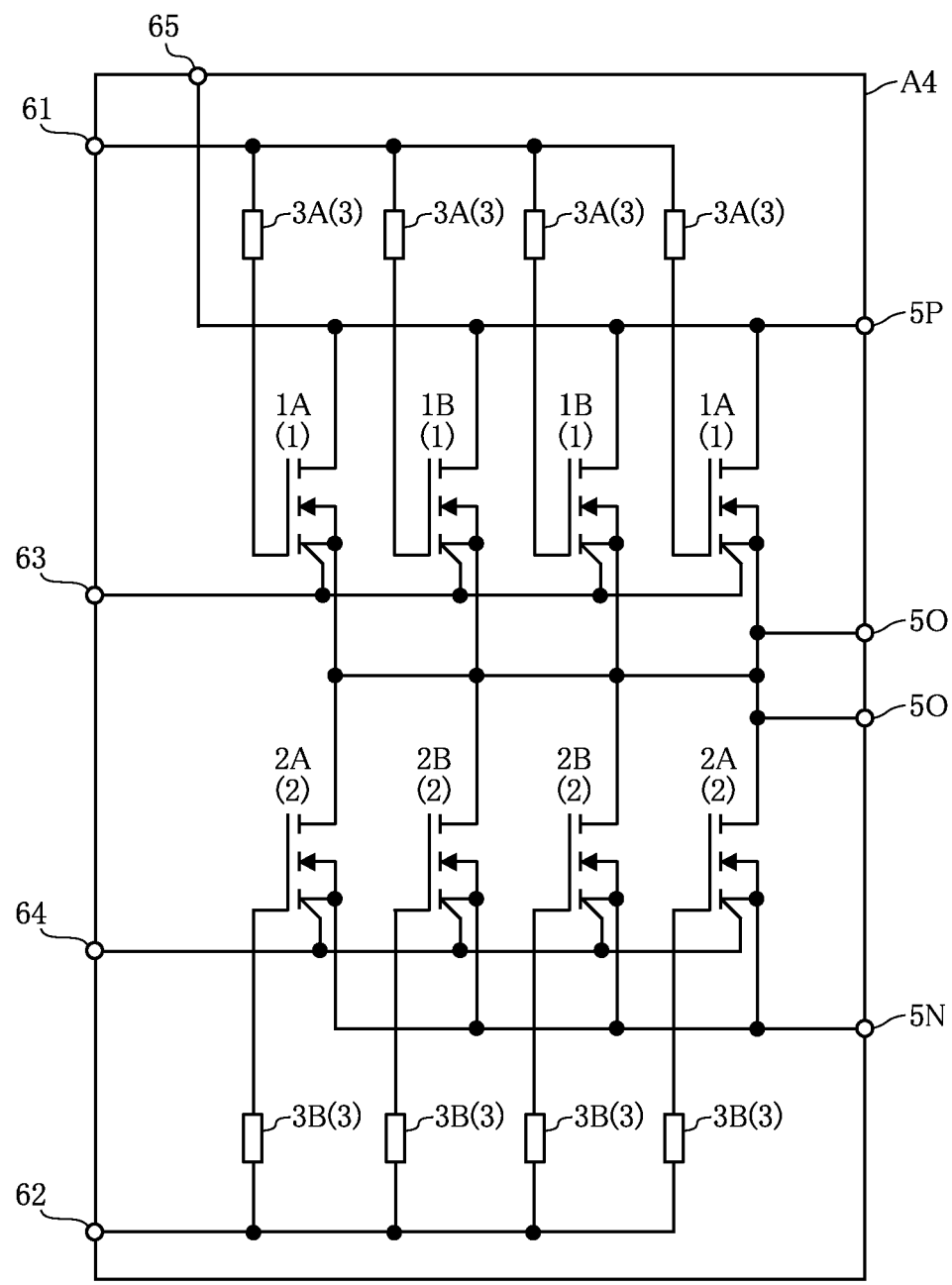
FIG. 23 shows an example of the circuit configuration of the semiconductor device according to the fourth embodiment.

FIGS. 22 and 23 show a semiconductor device A4 according to the fourth embodiment.

The semiconductor device A4 is different from the semiconductor device A1 mainly in the following points. As shown in FIG. 22, the signal wiring section 52 of the semiconductor device A4 further includes a strip portion 525. Similarly, the signal wiring section 53 of the semiconductor device A4 further includes a strip portion 535.

The strip portion 525 extends in the first direction x in plan view. The strip portion 525 is connected to the extending portion 523. The strip portion 525 is electrically connected to the bonding portion 521 via the extending portion 523. The first circuit components 3A are bonded to the strip portion 525. Each of the first circuit components 3A has one terminal bonded to the strip portion 525, and another terminal bonded to an individual portion 522. In the example shown in FIG. 22, the strip portion 525 is located between each of the first semiconductor elements 1 and each of the individual portions 522 in the second direction y. Accordingly, the connecting members 731 bonded to the respective individual portions 522 pass across the strip portion 525 in plan view. The strip portion 525 is an example of a "first strip portion".

The strip portion 535 extends in the first direction x in plan view. The strip portion 535 is connected to the extending portion 533. The strip portion 535 is electrically connected to the bonding portion 531 via the extending portion 533. The second circuit components 3B are bonded to the strip portion 535. Each of the second circuit components 3B has one terminal bonded to the strip portion 535, and another terminal bonded to an individual portion 532. In the example shown in FIG. 22, the strip portion 535 is located between each of the second semiconductor elements 2 and each of the individual portions 532 in the second direction y. Accordingly, the connecting members 732 bonded to the respective individual portions 532 pass across the strip portion 535 in plan view.

In the semiconductor device A4 configured as described above, the control terminal 61 is electrically connected to the third electrode 13 (gate electrode) of each first semiconductor element 1 via a first circuit component 3A, as shown in FIG. 23. Furthermore, the third electrodes 13 (gate electrodes) of any two of the first semiconductor elements 1 are electrically connected to each other via two first circuit components 3A. Similarly, as shown in FIG. 23, the control terminal 62 is electrically connected to the sixth electrode 23 (gate electrode) of each second semiconductor element 2 via a second circuit component 3B. Furthermore, the sixth electrodes 23 (gate electrodes) of any two of the second semiconductor elements 2 are electrically connected to each other via two second circuit components 3B.

As with the semiconductor device A1, the semiconductor device A4 can also suppress the resonance phenomenon that occurs when the first semiconductor elements 1 are operated in parallel. Furthermore, as with the semiconductor device A1, the semiconductor device A4 can also suppress the resonance phenomenon that occurs when the second semiconductor elements 2 are operated in parallel.

In the semiconductor device A4, the same number of first circuit components 3A is connected to the conduction path between the control terminal 61 and the third electrode 13 (gate electrode) for each first semiconductor element 1. This configuration can suppress the deviation of impedance in the conduction path from the control terminal 61 to the third electrode 13 of each first semiconductor element 1. As such, the semiconductor device A4 can suppress variations in the first drive signal inputted to each of the first semiconductor elements 1, thereby suppressing variations in the switching operations of the first semiconductor elements 1. The same applies to the circuit configuration of the lower arm. That is, in the semiconductor device A4, the same number of second circuit components 3B is connected to the conduction path between the detection terminal 62 and the sixth electrode 23 (gate electrode) for each second semiconductor element 2. As such, the semiconductor device A4 can suppress variations in the second drive signal inputted to each of the second semiconductor elements 2, thereby suppressing variations in the switching operations of the second semiconductor elements 2.

As with the semiconductor device A3, the semiconductor device A4 may use a plurality of first circuit components 3A connected in series, instead of each first circuit component 3A. In this case, a relay portion 524 may be provided between the strip portion 525 and each of the individual portions 522. Furthermore, as with the semiconductor device A3, it is possible to use a plurality of second circuit components 3B connected in series, instead of each second circuit component 3B. In this case, a relay portion 534 may be provided between the strip portion 535 and each of the individual portions 532.

Figure 24:
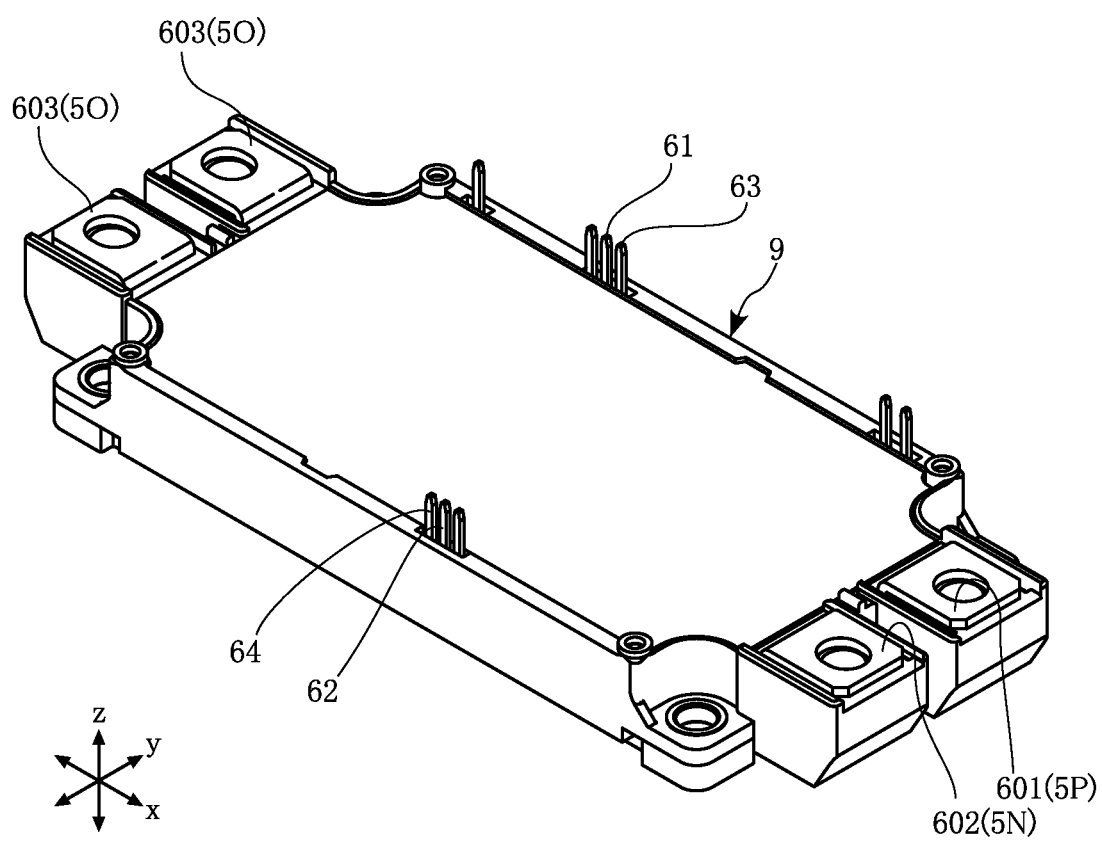
FIG. 24 is a perspective view showing a semiconductor device according to a variation.
Figure 25:
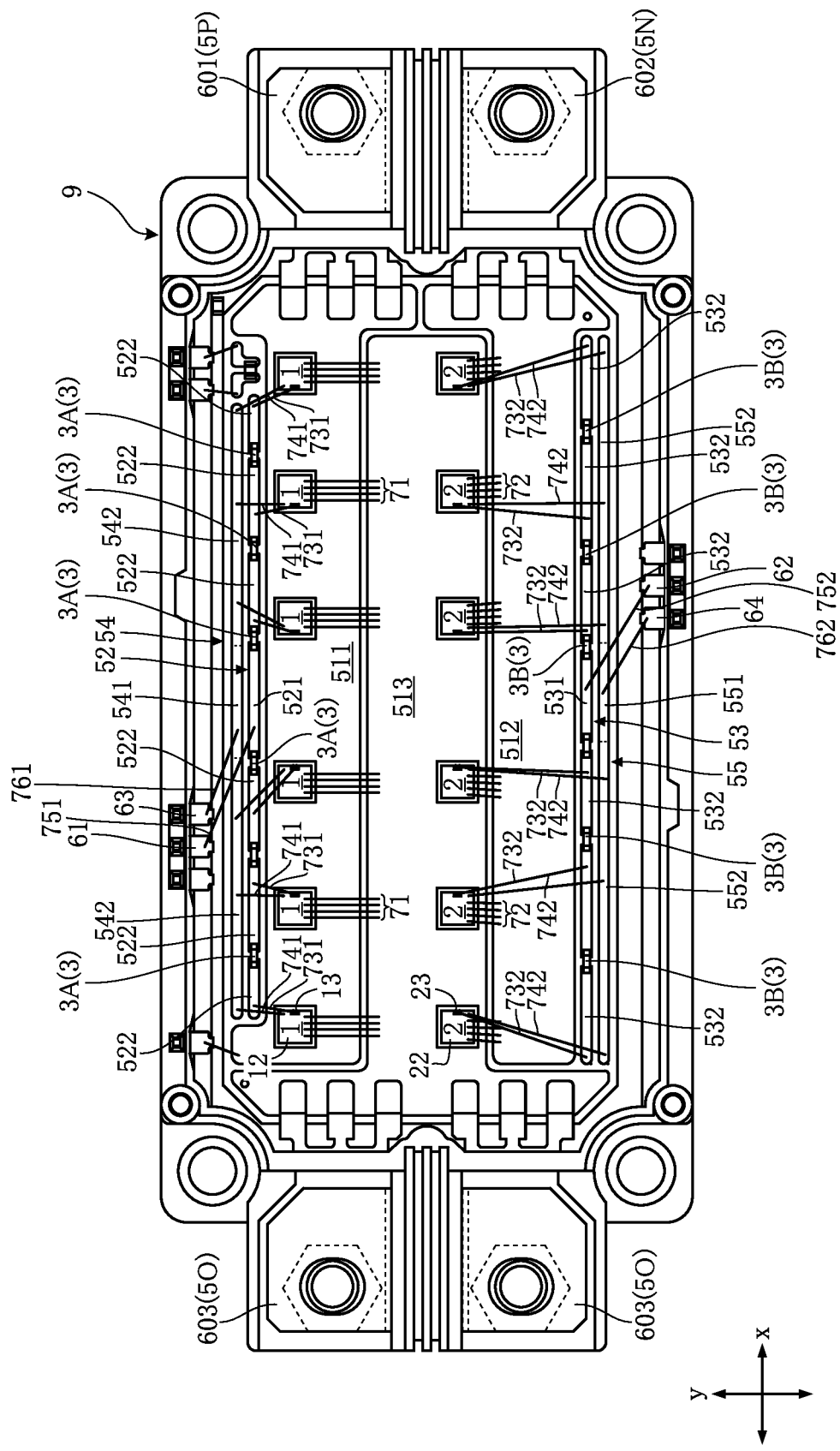
FIG. 25 is a plan view showing the semiconductor device shown in FIG. 24, with a part of the semiconductor device shown transparent.

The package structure of the semiconductor device according to the present disclosure is not limited to the resin mold type as exemplified by the semiconductor devices A1 to A4. The resin mold type refers to a package structure in which, as exemplified by the semiconductor devices A1 to A4, the first semiconductor elements 1, the second semiconductor elements 2, etc., are covered with the resin member 8. For example, the semiconductor device according to the present disclosure may be of a case type as shown in FIGS. 24 and 25. The case type refers to a package structure in which the first semiconductor elements 1, the second semiconductor elements 2, etc., are housed in, for example, a case 9 made of resin, as shown in FIGS. 24 and 25.

The semiconductor device shown in FIGS. 24 and 25 includes a power terminal 601 as the first power terminal portion 5P, a power terminal 602 as the second power terminal portion 5N, and two power terminals 603 as the third power terminal portions 5O. Each of the power terminals 601 to 603 includes a portion housed in the case 9 and a portion exposed from the case 9. In the power terminal 601, the portion housed in the case 9 is partially bonded to the power wiring section 511. The first semiconductor elements 1 are mounted on the power wiring section 511. In the power terminal 602, the portion housed in the case 9 is partially bonded to the power wiring section 512. In the power terminal 603, the portion housed in the case 9 is partially bonded to the power wiring section 513. The second semiconductor elements 2 are mounted on the power wiring section 513. In the semiconductor device shown in FIGS. 24 and 25, the power wiring section 511 is an example of a "first mounting portion" and the power wiring section 513 is an example of a "second mounting portion."

In the example shown in FIGS. 24 and 25, the signal wiring section 54 includes two strip portions 542. The two strip portions 542 are arranged at respective sides of the bonding portion 541 in the first direction x, and are connected to the bonding portion 541. Each of the connecting members 741 is bonded to one of the two strip portions 542. The signal wiring section 55 includes two strip portions 552. The two strip portions 552 are arranged at respective sides of the bonding portion 551 in the first direction x, and are connected to the bonding portion 551. Each of the connecting members 742 is bonded to one of the two strip portions 552.

In the example shown in FIGS. 24 and 25, the control terminal 61 and the bonding portion 521 are electrically connected to each other via a connecting member 751. The control terminal 62 and the bonding portion 531 are electrically connected to each other via a connecting member 752. The detection terminal 63 and the bonding portion 541 are electrically connected to each other via a connecting member 761. The detection terminal 64 and the bonding portion 551 are electrically connected to each other via a connecting member 762. The connecting members 751, 752, 761, and 762 are bonding wires.

The semiconductor device according to the present disclosure is not limited to having a configuration where the groups of the first semiconductor elements 1 and the second semiconductor elements 2 are each operated in parallel. For example, the semiconductor device of the present disclosure may not include the second semiconductor elements 2, and may operate the first semiconductor elements 1 in parallel.

The semiconductor device according to the present disclosure is not limited to having a configuration where each of the first power terminal portion 5P, the second power terminal portion 5N, and the third power terminal portions 5O is arranged on either side of the alignment direction of the first semiconductor elements 1 and of the second semiconductor elements 2 (first direction x). The semiconductor device according to the present disclosure may be configured such that each of the first power terminal portion 5P, the second power terminal portion 5N, and the third power terminal portions 5O is arranged in either a direction (second direction y) intersecting the alignment direction (first direction x) of the first semiconductor elements 1 or a direction (second direction y) intersecting the alignment direction (first direction x) of the second semiconductor elements 2.

The semiconductor device according to the present disclosure is not limited to the above embodiments. Various design changes can be made to the specific configurations of the elements of the semiconductor device according to the present disclosure. For example, the present disclosure includes the embodiments described in the following clauses.

Clause 1.

A semiconductor device comprising:
 a plurality of first semiconductor elements that each have a first electrode, a second electrode, and a third electrode, a switching operation of each of the plurality of first semiconductor elements being controlled according to a first drive signal inputted to the third electrode;
 a first control terminal for inputting the first drive signal;
 a first conductive member electrically connected to the first control terminal and electrically interposed between the third electrodes of the plurality of first semiconductor elements; and
 a plurality of first circuit components that are connected to the first conductive member and increase an impedance in a first frequency band,
 wherein the plurality of first semiconductor elements are electrically connected to each other in parallel,
 the first frequency band includes a resonance frequency of a resonance circuit that is formed by including a parasitic inductance of the first conductive member, and
 the third electrodes of the plurality of first semiconductor elements are electrically connected to each other via at least one of the plurality of first circuit components.

Clause 2.

The semiconductor device according to clause 1, wherein each of the plurality of first circuit components is an inductance element.

Clause 3.

The semiconductor device according to clause 2, wherein the inductance element is a ferrite bead.

Clause 4.

The semiconductor device according to any of clauses 1 to 3, wherein the first conductive member includes a first signal wiring section to which the first control terminal is connected and that transmits the first drive signal, and a plurality of first connecting members respectively connected to the third electrodes of the plurality of first semiconductor elements, the first signal wiring section includes a plurality of first individual portions that are spaced apart from each other, and the plurality of first connecting members are respectively connected to the plurality of first individual portions.

Clause 5.

The semiconductor device according to clause 4, wherein each of the plurality of first individual portions is bonded to one of the plurality of first circuit components.

Clause 6.

The semiconductor device according to clause 5, wherein the plurality of first semiconductor elements are aligned in a first direction perpendicular to a thickness direction of the plurality of first semiconductor elements, and the plurality of first individual portions are aligned in the first direction, and are located in a first sense of a second direction with respect to the plurality of first semiconductor elements, the second direction being perpendicular to the thickness direction and the first direction.

Clause 7.

The semiconductor device according to clause 6, wherein the first control terminal is located in a first sense of the first direction from the plurality of first semiconductor elements, the first signal wiring section includes a first bonding portion to which the first control terminal is bonded, and the first bonding portion is electrically connected to each of the plurality of first individual portions.

Clause 8.

The semiconductor device according to clause 7, wherein the plurality of first individual portions include two first individual portions adjacent to each other in the first direction, and the two first individual portions are electrically connected to each other via at least one of the plurality of first circuit components.

Clause 9.

The semiconductor device according to clause 7, wherein the first signal wiring section includes a first strip portion extending in the first direction as viewed in the thickness direction, the first strip portion is electrically connected to the first bonding portion, and each of the plurality of first circuit components is bonded to the first strip portion and a corresponding one of the plurality of first individual portions.

Clause 10.

The semiconductor device according to clause 9, wherein the first strip portion is located between each of the plurality of first semiconductor elements and each of the plurality of first individual portions in the second direction, and the plurality of first connecting members intersect the first strip portion as viewed in the thickness direction.

Clause 11.

The semiconductor device according to any of clauses 6 to 10, further comprising:

a plurality of second semiconductor elements that each have a fourth electrode, a fifth electrode, and a sixth electrode, a switching operation of each of the plurality of second semiconductor elements being controlled according to a second drive signal inputted to the sixth electrode;

a second control terminal to which the second drive signal is inputted;

a second conductive member electrically connected to the second control terminal and electrically connecting the sixth electrodes of the plurality of second semiconductor elements; and a plurality of second circuit components that are connected to the second conductive member and increase an impedance in a second frequency band, wherein the plurality of second semiconductor elements are electrically connected to each other in parallel, the second frequency band includes a resonance frequency of a resonance circuit that is formed by including a parasitic inductance of the second conductive member, and the sixth electrodes of the plurality of second semiconductor elements are electrically connected to each other via at least one of the plurality of second circuit components.

Clause 12.

The semiconductor device according to clause 11, wherein the second conductive member includes a second signal wiring section to which the second control terminal is connected and that transmits the second drive signal, and a plurality of second connecting members respectively connected to the sixth electrodes of the plurality of second semiconductor elements, the second signal wiring section includes a plurality of second individual portions that are spaced apart from each other, and the plurality of second connecting members are respectively connected to the plurality of second individual portions.

Clause 13.

The semiconductor device according to clause 12, wherein each of the plurality of second individual portions is bonded to one of the plurality of second circuit components.

Clause 14.

The semiconductor device according to clause 13, wherein the plurality of second semiconductor elements are aligned in the first direction, and are located opposite from the plurality of first individual portions with respect to the second direction more than the plurality of first semiconductor elements are, and the plurality of second individual portions are aligned in the first direction, and are located opposite from the plurality of first semiconductor elements with respect to the second direction more than the plurality of second semiconductor elements are.

Clause 15.

The semiconductor device according to clause 14, wherein the second control terminal is located in a first sense of the first direction from the plurality of second semiconductor elements, the second signal wiring section includes a second bonding portion to which the second control terminal is bonded, and the second bonding portion is electrically connected to each of the plurality of second individual portions.

Clause 16.

The semiconductor device according to any of clauses 12 to 15, further comprising an insulating substrate having a substrate obverse surface and a substrate reverse surface that are spaced apart from each other in the thickness direction, wherein the first signal wiring section and the second signal wiring section are formed on the substrate obverse surface.

Clause 17.

The semiconductor device according to clause 16, wherein each of the plurality of first semiconductor elements has a first-element obverse surface facing in a same direction as the substrate obverse surface in the thickness direction, and a first-element reverse surface facing in a same direction as the substrate reverse surface in the thickness direction,
the first electrode is formed on the first-element reverse surface,
the second electrode and the third electrode are formed on the first-element obverse surface,
each of the plurality of second semiconductor elements has a second-element obverse surface facing in a same direction as the first-element obverse surface in the thickness direction, and a second-element reverse surface facing in a same direction as the first-element reverse surface in the thickness direction,
the fourth electrode is formed on the second-element reverse surface, and
the fifth electrode and the sixth electrode are formed on the second-element obverse surface.

Clause 18.

The semiconductor device according to clause 17, further comprising:
a first mounting portion on which the plurality of first semiconductor elements are mounted; and
a second mounting portion on which the plurality of second semiconductor elements are mounted,
wherein the first mounting portion and the second mounting portion are each made of an electrically conductive material and are spaced apart from each other,
the first electrodes of the plurality of first semiconductor elements are electrically connected to each other via the first mounting portion, and
the fourth electrodes of the plurality of second semiconductor elements are electrically connected to each other via the second mounting portion.

Clause 19.

The semiconductor device according to clause 18, wherein the first mounting portion and the second mounting portion face the substrate reverse surface,
the insulating substrate includes a plurality of first openings and a plurality of second openings that penetrate through from the substrate obverse surface to the substrate reverse surface in the thickness direction,
each of the plurality of first openings surrounds a different one of the plurality of first semiconductor elements as viewed in the thickness direction, and
each of the plurality of second openings surrounds a different one of the plurality of second semiconductor elements as viewed in the thickness direction.

Clause 20.

The semiconductor device according to any of clauses 16 to 19, further comprising:
a first power terminal portion electrically connected to the first electrodes of the plurality of first semiconductor elements;
a second power terminal portion electrically connected to the fifth electrodes of the plurality of second semiconductor elements; and
a third power terminal portion electrically connected to the second electrodes of the plurality of first semiconductor elements and the fourth electrodes of the plurality of second semiconductor elements,
wherein the first power terminal portion and the second power terminal portion receive direct-current voltage,
the direct-current voltage is converted to alternating-current voltage by the switching operations of the plurality of first semiconductor elements and the plurality of second semiconductor elements, and
the alternating-current voltage is outputted from the third power terminal portion.

REFERENCE SIGNS

A1 to A4: Semiconductor device 1: First semiconductor element
1A: First outer element 1B: First inner element
10a: Element obverse surface 10b: Element reverse surface
11: First electrode
12: Second electrode 121: First power pad
122: First detection pad 13: Third electrode
19: Conductive bonding member 2: Second semiconductor element
2A: Second outer element 2B: Second inner element 20a: Element obverse surface
20b: Element reverse surface 21: Fourth electrode 22: Fifth electrode
221: Second power pad 222: Second detection pad
23: Sixth electrode 29: Conductive bonding member 3: Circuit component
3A: First circuit component 3B: Second circuit component
4: Supporting member
41, 42: Conductive plate 41a, 42a: Mounting surface
419, 429: Bonding member 43, 44: Insulating plate
44: Insulating plate 50: Insulating substrate 501: Obverse surface
502: Reverse surface 503, 504: Through-hole 505, 506: Opening
511, 512, 513, 514: Power wiring section
511a, 514a: Opening 511b, 513a, 514b: Through-hole
5P: First power terminal portion 5N: Second power terminal portion
5O: Third power terminal portion 52: Signal wiring section
521: Bonding portion
522: Individual portion 523: Extending portion 524: Relay portion
525: Strip portion 53: Signal wiring section 531: Bonding portion
532: Individual portion 533: Extending portion 534: Relay portion
535: Strip portion 54: Signal wiring section 541: Bonding portion
542: Strip portion 543: Pad portion 544: Extending portion
55: Signal wiring section 551: Bonding portion 552: Strip portion
553: Pad portion 554: Extending portion 56: Signal wiring section
561: Through-hole 58, 59: Metal member 61, 62: Control terminal
63, 64, 65: Detection terminal 601 to 603: Power terminal portion
7: Connecting member 71, 72: Connecting member 731, 732: Connecting member
741, 742: Connecting member 751, 752: Connecting member 761, 762: Connecting member 8: Resin member 81: Resin obverse surface
82: Resin reverse surface 831 to 834: Resin side surface
9: Case

The invention claimed is:
1. A semiconductor device comprising:
a plurality of first semiconductor elements that each have a first electrode, a second electrode, and a third electrode, a switching operation of each of the plurality of first semiconductor elements being controlled according to a first drive signal inputted to the third electrode;
a first control terminal for inputting the first drive signal;
a first conductive member electrically connected to the first control terminal and electrically interposed between the third electrodes of the plurality of first semiconductor elements;
a plurality of first circuit components that are connected to the first conductive member and increase an impedance in a first frequency band;
a plurality of second semiconductor elements that each have a fourth electrode, a fifth electrode, and a sixth electrode, a switching operation of each of the plurality of second semiconductor elements being controlled according to a second drive signal inputted to the sixth electrode;
a second control terminal to which the second drive signal is inputted;
a second conductive member electrically connected to the second control terminal and electrically connecting the sixth electrodes of the plurality of second semiconductor elements;
a plurality of second circuit components that are connected to the second conductive member and increase an impedance in a second frequency band; and
an insulating substrate having a substrate obverse surface and a substrate reverse surface that are spaced apart from each other in the thickness direction,
wherein the plurality of first semiconductor elements are electrically connected to each other in parallel,
the first frequency band includes a resonance frequency of a resonance circuit that is formed by including a parasitic inductance of the first conductive member,
the third electrodes of the plurality of first semiconductor elements are electrically connected to each other via at least one of the plurality of first circuit components,
the first conductive member includes a first signal wiring section to which the first control terminal is connected and that transmits the first drive signal, and a plurality of first connecting members respectively connected to the third electrodes of the plurality of first semiconductor elements,
the first signal wiring section includes a plurality of first individual portions that are spaced apart from each other,
the plurality of first connecting members are respectively connected to the plurality of first individual portions,
each of the plurality of first individual portions is bonded to one of the plurality of first circuit components,
the plurality of first semiconductor elements are aligned in a first direction perpendicular to a thickness direction of the plurality of first semiconductor elements,
the plurality of first individual portions are aligned in the first direction, and are located on a first side in a second direction with respect to the plurality of first semiconductor elements, the second direction being perpendicular to the thickness direction and the first direction,
the plurality of second semiconductor elements are electrically connected to each other in parallel,
the second frequency band includes a resonance frequency of a resonance circuit that is formed by including a parasitic inductance of the second conductive member,
the sixth electrodes of the plurality of second semiconductor elements are electrically connected to each other via at least one of the plurality of second circuit components,
the second conductive member includes a second signal wiring section to which the second control terminal is connected and that transmits the second drive signal, and a plurality of second connecting members respectively connected to the sixth electrodes of the plurality of second semiconductor elements,
the second signal wiring section includes a plurality of second individual portions that are spaced apart from each other,
the plurality of second connecting members are respectively connected to the plurality of second individual portions,
the first signal wiring section and the second signal wiring section are formed on the substrate obverse surface,
each of the plurality of first semiconductor elements has a first-element obverse surface facing in a same direction as the substrate obverse surface in the thickness direction, and a first-element reverse surface facing in a same direction as the substrate reverse surface in the thickness direction,
the first electrode is formed on the first-element reverse surface,
the second electrode and the third electrode are formed on the first-element obverse surface,
each of the plurality of second semiconductor elements has a second-element obverse surface facing in a same direction as the first-element obverse surface in the thickness direction, and a second-element reverse surface facing in a same direction as the first-element reverse surface in the thickness direction,
the fourth electrode is formed on the second-element reverse surface, and
the fifth electrode and the sixth electrode are formed on the second-element obverse surface.

2. The semiconductor device according to claim 1, wherein each of the plurality of first circuit components is an inductance element.

3. The semiconductor device according to claim 2, wherein the inductance element is a ferrite bead.

4. The semiconductor device according to claim 1, wherein
the first control terminal is located on the first side in the first direction as viewed from the plurality of first semiconductor elements,
the first signal wiring section includes a first bonding portion to which the first control terminal is bonded, and
the first bonding portion is electrically connected to each of the plurality of first individual portions.

5. The semiconductor device according to claim 1, wherein the plurality of first individual portions include two first individual portions adjacent to each other in the first direction, and the two first individual portions are electrically connected to each other via at least one of the plurality of first circuit components.

6. The semiconductor device according to claim 1, wherein the first signal wiring section includes a first strip portion extending in the first direction as viewed in the thickness direction, the first strip portion is electrically connected to the first bonding portion, and each of the plurality of first circuit components is bonded to the first strip portion and a corresponding one of the plurality of first individual portions.

7. The semiconductor device according to claim 6, wherein the first strip portion is located between each of the plurality of first semiconductor elements and each of the plurality of first individual portions in the second direction, and the plurality of first connecting members intersect the first strip portion as viewed in the thickness direction.

8. The semiconductor device according to claim 1, wherein each of the plurality of second individual portions is bonded to one of the plurality of second circuit components.

9. The semiconductor device according to claim 8, wherein the plurality of second semiconductor elements are aligned in the first direction, and are located opposite from the plurality of first individual portions with respect to the second direction more than the plurality of first semiconductor elements are, and the plurality of second individual portions are aligned in the first direction, and are located opposite from the plurality of first semiconductor elements with respect to the second direction more than the plurality of second semiconductor elements are.

10. The semiconductor device according to claim 9, wherein the second control terminal is located on a first side in the first direction as viewed from the plurality of second semiconductor elements, the second signal wiring section includes a second bonding portion to which the second control terminal is bonded, and the second bonding portion is electrically connected to each of the plurality of second individual portions.

11. The semiconductor device according to claim 1, further comprising:

a first mounting portion on which the plurality of first semiconductor elements are mounted; and a second mounting portion on which the plurality of second semiconductor elements are mounted, wherein the first mounting portion and the second mounting portion are each made of an electrically conductive material and are spaced apart from each other, the first electrodes of the plurality of first semiconductor elements are electrically connected to each other via the first mounting portion, and the fourth electrodes of the plurality of second semiconductor elements are electrically connected to each other via the second mounting portion.

12. The semiconductor device according to claim 11, wherein the first mounting portion and the second mounting portion face the substrate reverse surface, the insulating substrate includes a plurality of first openings and a plurality of second openings that penetrate through from the substrate obverse surface to the substrate reverse surface in the thickness direction, each of the plurality of first openings surrounds a different one of the plurality of first semiconductor elements as viewed in the thickness direction, and each of the plurality of second openings surrounds a different one of the plurality of second semiconductor elements as viewed in the thickness direction.

13. The semiconductor device according to claim 1, further comprising:

a first power terminal portion electrically connected to the first electrodes of the plurality of first semiconductor elements;

a second power terminal portion electrically connected to the fifth electrodes of the plurality of second semiconductor elements; and a third power terminal portion electrically connected to the second electrodes of the plurality of first semiconductor elements and the fourth electrodes of the plurality of second semiconductor elements, wherein the first power terminal portion and the second power terminal portion receive direct-current voltage, the direct-current voltage is converted to alternating-current voltage by the switching operations of the plurality of first semiconductor elements and the plurality of second semiconductor elements, and the alternating-current voltage is outputted from the third power terminal portion.

* * * * *